US012648127B2

(12) United States Patent
Kim et al.

(10) Patent No.: US 12,648,127 B2
(45) Date of Patent: Jun. 2, 2026

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Eunjung Kim, Suwon-si (KR); Eun A Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 499 days.

(21) Appl. No.: 18/116,475

(22) Filed: Mar. 2, 2023

(65) Prior Publication Data

US 2024/0074146 A1 Feb. 29, 2024

(30) Foreign Application Priority Data

Aug. 25, 2022 (KR) ........................ 10-2022-0107070

(51) Int. Cl.
| | |
|---|---|
| *H10B 12/00* | (2023.01) |
| *H10B 61/00* | (2023.01) |
| *H10B 63/00* | (2023.01) |
| *H10B 63/10* | (2023.01) |

(52) U.S. Cl.
CPC ....... *H10B 12/315* (2023.02); *H10B 12/0335* (2023.02); *H10B 61/22* (2023.02); *H10B 63/10* (2023.02); *H10B 63/30* (2023.02)

(58) Field of Classification Search
CPC .. H10B 12/315; H10B 12/0335; H10B 61/22; H10B 63/10; H10B 63/30; H10B 12/482; H10B 63/34; H10B 12/36
See application file for complete search history.

(56) References Cited

U.S. PATENT DOCUMENTS

| | | | |
|---|---|---|---|
| 8,093,724 | B2 | 1/2012 | Hasunuma |
| 9,177,891 | B2 | 11/2015 | Kim et al. |
| 9,202,775 | B2 | 12/2015 | Jung et al. |
| 9,257,297 | B2 | 2/2016 | Gwak |
| 9,490,256 | B2 | 11/2016 | Kim et al. |
| 9,859,284 | B2 | 1/2018 | Wang |
| 10,468,350 | B2 | 11/2019 | Kim et al. |
| 11,107,785 | B2 | 8/2021 | Hsu |
| 11,114,380 | B2 | 9/2021 | Chuang et al. |

(Continued)

FOREIGN PATENT DOCUMENTS

| | | |
|---|---|---|
| CN | 111584487 A | 8/2020 |

*Primary Examiner* — Yasser A Abdelaziez
(74) *Attorney, Agent, or Firm* — Muir Patent Law, PLLC

(57) ABSTRACT

A semiconductor device and a method of fabricating a semiconductor device, the semiconductor device includes an active pattern; a gate structure on the active pattern; a bit-line structure electrically connected to the active pattern; a storage node contact electrically connected to the active pattern; and a landing pad electrically connected to the storage node contact, wherein the landing pad includes a first pad flat sidewall and a second pad flat sidewall that are opposite to each other, a third pad flat sidewall between the first pad flat sidewall and the second pad flat sidewall, a fourth pad flat sidewall between the first pad flat sidewall and the second pad flat sidewall, a first pad curved sidewall between the first pad flat sidewall and the third pad flat sidewall, and a second pad curved sidewall between the first pad flat sidewall and the fourth pad flat sidewall.

20 Claims, 31 Drawing Sheets

(56)  References Cited

U.S. PATENT DOCUMENTS

| | | | |
|---|---|---|---|
| 2005/0003646 A1* | 1/2005 | Park | H10D 1/716 |
| | | | 257/E21.59 |
| 2012/0135579 A1* | 5/2012 | Park | H10B 12/485 |
| | | | 257/E21.546 |
| 2015/0214230 A1* | 7/2015 | Kim | H10B 12/315 |
| | | | 257/773 |
| 2016/0056159 A1* | 2/2016 | Kim | H10B 12/315 |
| | | | 257/532 |
| 2022/0005811 A1* | 1/2022 | Kim | H10B 12/053 |
| 2022/0122978 A1 | 4/2022 | Jin et al. | |

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2022-0107070 filed on Aug. 25, 2022, in the Korean Intellectual Property Office, the disclosure of which is hereby incorporated by reference in its entirety.

BACKGROUND

1. Field

Embodiments relate to a semiconductor device and a method of fabricating the same.

2. Description of the Related Art

Semiconductor devices are beneficial in the electronic industry because of their small size, multi-functionality, and low fabrication cost. Semiconductor devices may encompass semiconductor memory devices storing logic data, semiconductor logic devices processing operations of logic data, and hybrid semiconductor devices having both memory and logic elements.

SUMMARY

The embodiments may be realized by providing a semiconductor device including an active pattern; a gate structure on the active pattern; a bit-line structure electrically connected to the active pattern; a storage node contact electrically connected to the active pattern; and a landing pad electrically connected to the storage node contact, wherein the landing pad includes a first pad flat sidewall and a second pad flat sidewall that are opposite to each other, a third pad flat sidewall between the first pad flat sidewall and the second pad flat sidewall, a fourth pad flat sidewall between the first pad flat sidewall and the second pad flat sidewall, a first pad curved sidewall between the first pad flat sidewall and the third pad flat sidewall, and a second pad curved sidewall between the first pad flat sidewall and the fourth pad flat sidewall.

The embodiments may be realized by providing a semiconductor device including an active pattern; a bit-line structure electrically connected to the active pattern; a storage node contact electrically connected to the active pattern; and a landing pad electrically connected to the storage node contact, wherein the landing pad includes a first pad flat sidewall and a second pad flat sidewall that are opposite to each other, a third pad flat sidewall between the first pad flat sidewall and the second pad flat sidewall, and a fourth pad flat sidewall between the first pad flat sidewall and the second pad flat sidewall, wherein the first pad flat sidewall and the second pad flat sidewall are parallel to each other, and wherein the third pad flat sidewall and the fourth pad flat sidewall are parallel to each other.

The embodiments may be realized by providing a semiconductor device including an active pattern; a gate structure on the active pattern; a dielectric pattern on the gate structure; a bit-line structure on the dielectric pattern; a storage node contact on a sidewall of the bit-line structure; a landing pad electrically connected to the storage node contact; and a filling pattern that surrounds the landing pad, wherein the landing pad includes a lower part connected to the storage node contact, and an upper part on the lower part of the landing pad, wherein the upper part of the landing pad includes a first pad flat sidewall and a second pad flat sidewall that are opposite to each other, a third pad flat sidewall between the first pad flat sidewall and the second pad flat sidewall, a fourth pad flat sidewall between the first pad flat sidewall and the second pad flat sidewall, a first pad curved sidewall connected to the first pad flat sidewall and the third pad flat sidewall, a second pad curved sidewall connected to the first pad flat sidewall and the fourth pad flat sidewall, a third pad curved sidewall connected to the second pad flat sidewall and the third pad flat sidewall, and a fourth pad curved sidewall connected to the second pad flat sidewall and the fourth pad flat sidewall, wherein the first to fourth pad flat sidewalls are flat, wherein the first to fourth pad curved sidewalls are curved, and wherein a distance between the first pad curved sidewall and the fourth pad curved sidewall is greater than a distance between the second pad curved sidewall and the third pad curved sidewall.

The embodiments may be realized by providing a method of fabricating a semiconductor device, the method including forming an active pattern on a substrate; forming a bit-line structure electrically connected to the active pattern; forming a storage node contact electrically connected to the active pattern; forming a preliminary pad layer that covers the bit-line structure; forming a mask structure on the preliminary pad layer; etching the mask structure to form a base pattern; and using the base pattern as an etching mask to etch the preliminary pad layer, wherein the base pattern includes a first base flat sidewall and a second base flat sidewall that are opposite to each other, a third base flat sidewall and a fourth base flat sidewall that are opposite to each other, a first base curved sidewall between the first base flat sidewall and the third base flat sidewall, a second base curved sidewall between the first base flat sidewall and the fourth base flat sidewall, a third base curved sidewall between the second base flat sidewall and the third base flat sidewall, and a fourth base curved sidewall between the second base flat sidewall and the fourth base flat sidewall.

BRIEF DESCRIPTION OF THE DRAWINGS

Features will be apparent to those of skill in the art by describing in detail exemplary embodiments with reference to the attached drawings in which:

FIGS. 2, 3, 4, 5, 6A, 6B, 7A, 7B, 8A, 8B, 9A, 9B, 9C, 10A, 10B, 10C, 11A, 11B, and 11C illustrate stages in a method of fabricating a semiconductor device depicted in FIGS. 1A to 1C.

DETAILED DESCRIPTION

Figure 1A:
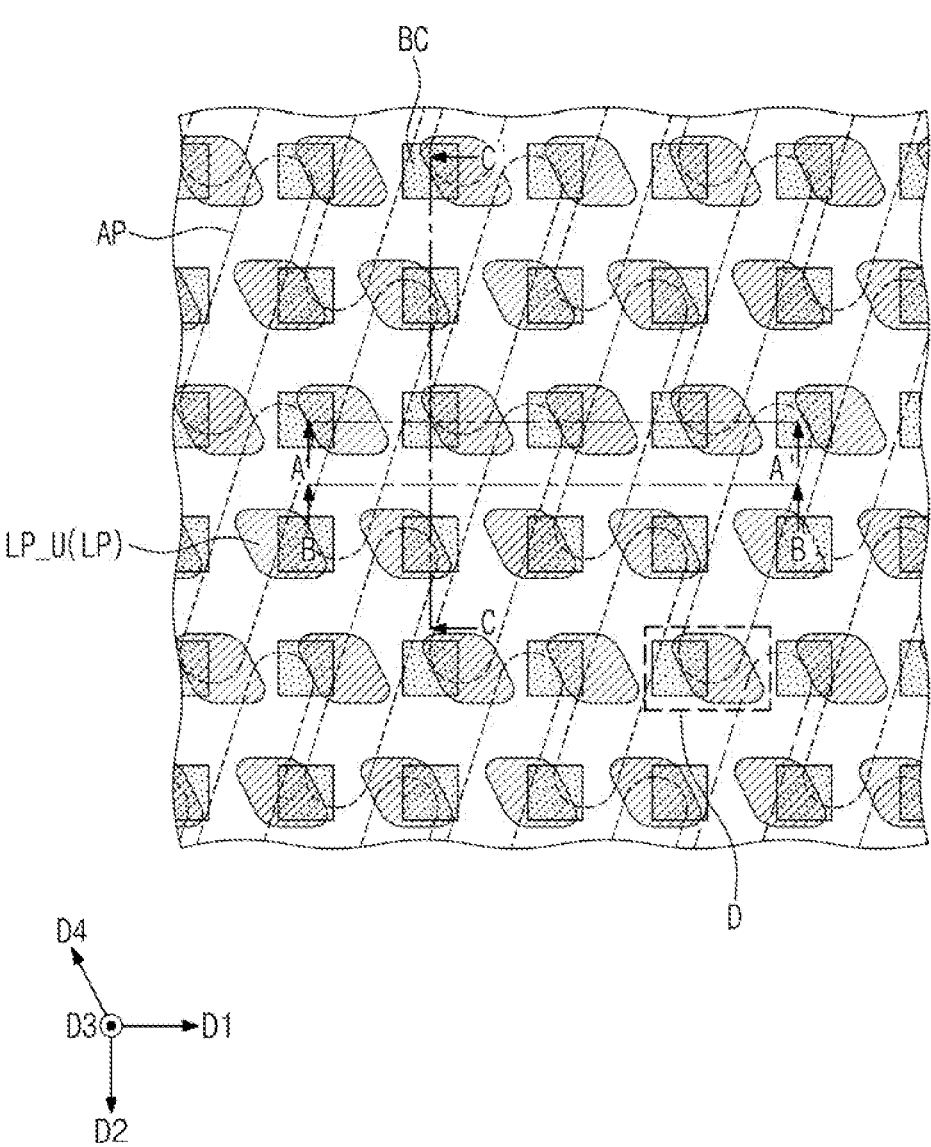
FIG. 1A illustrates a plan view showing a semiconductor device according to some embodiments.
Figure 1B:
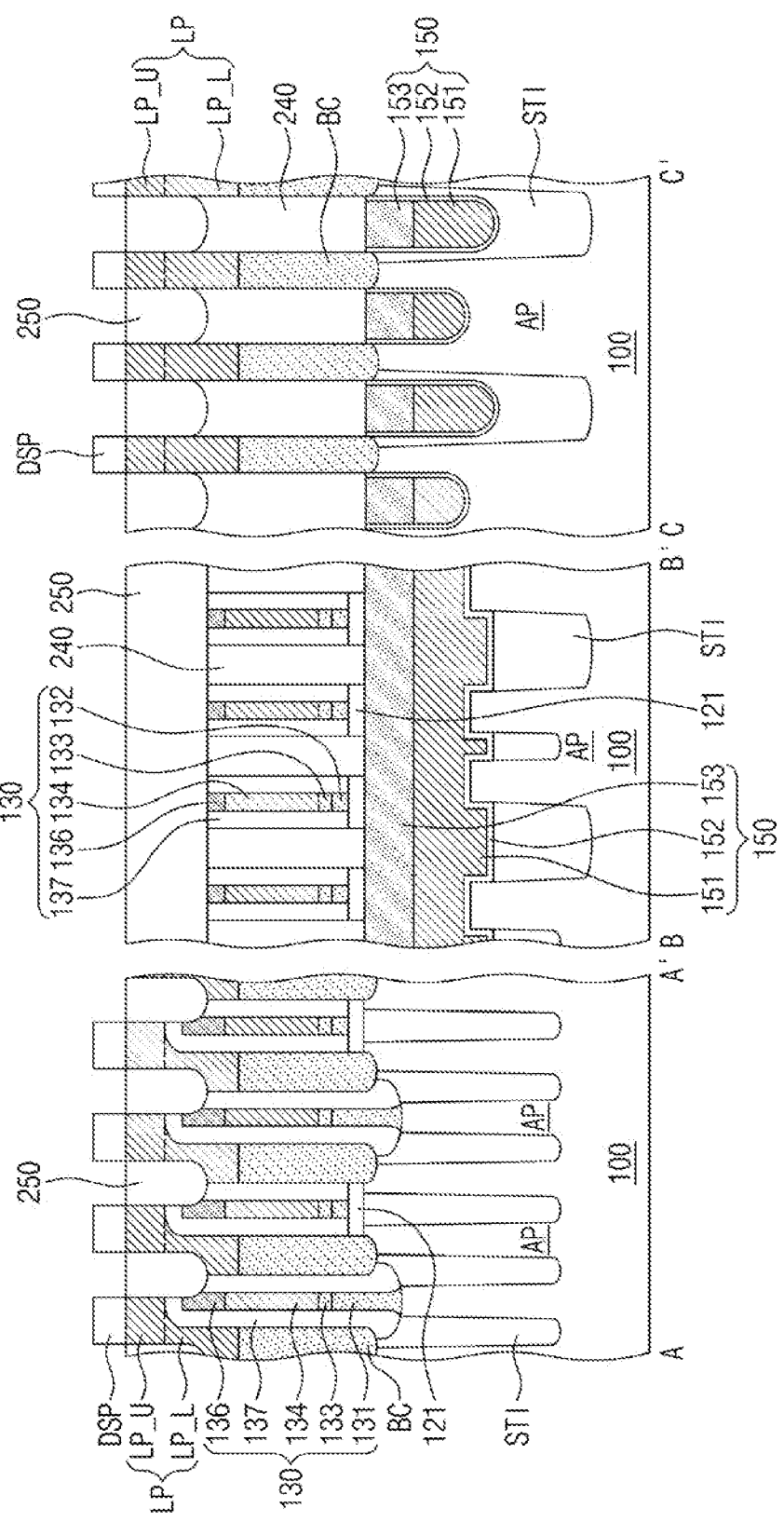
FIG. 1B illustrates a cross-sectional view taken along lines A-A', B-B', and C-C' of FIG. 1A.
Figure 1C:
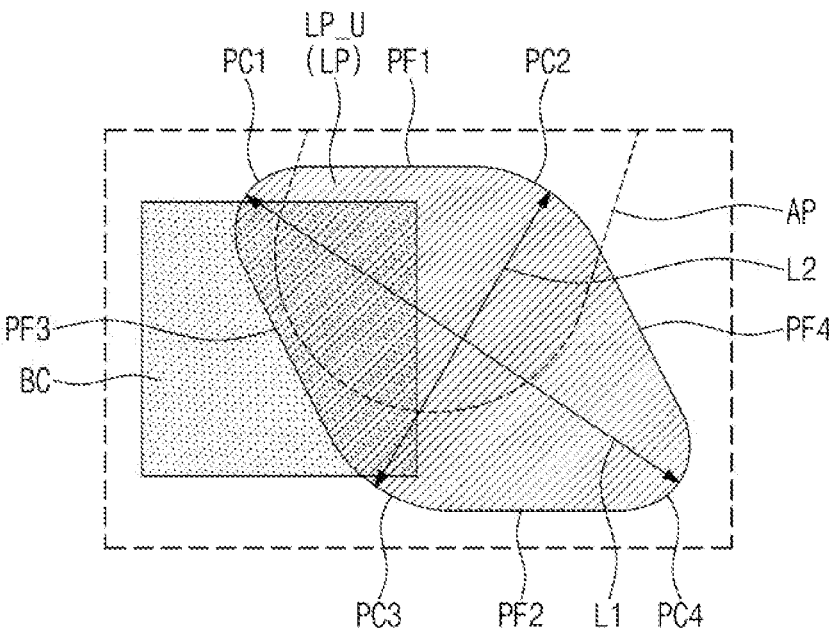
FIG. 1C illustrates an enlarged view showing section D of FIG. 1A.
Figure 1C:
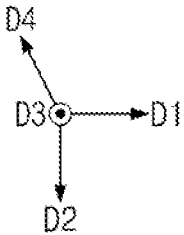

FIG. 1A illustrates a plan view showing a semiconductor device according to some embodiments. FIG. 1B illustrates a cross-sectional view taken along lines A-A', B-B', and C-C' of FIG. 1A. FIG. 1C illustrates an enlarged view showing section D of FIG. 1A.

Referring to FIGS. 1A and 1*i*, a semiconductor device may include a substrate 100. In an implementation, the substrate 100 may be a semiconductor substrate. In an implementation, the substrate 100 may include silicon (Si), germanium (Ge), silicon-germanium (SiGe), gallium phosphide (GaP), or gallium arsenide (GaAs). In an implementation, the substrate 100 may be a silicon-on-insulator (SOI) substrate or a germanium-on-insulator (GOI) substrate. The substrate 100 may have a plate shape that extends along a plane elongated in a first direction D1 and a second direction D2. The first direction D1 and the second direction D2 may intersect each other. In an implementation, the first direction D1 and the second direction D2 may be horizontal directions that are orthogonal to each other. As used herein, the term "or" is not an exclusive term, e.g., "A or B" would include A, B, or A and B.

The substrate 100 may include active patterns AP. Active patterns AP may be defined to refer to upper parts of the substrate 100 that protrude in a vertical third direction D3. The active pattern AP may be spaced apart from each other.

A device isolation layer STI may be in a space between the active patterns AP. The device isolation layer STI may be in the substrate 100. The active patterns AP may be defined by the device isolation layer STI. Each of the active patterns AP may be surrounded by the device isolation layer STI. The device isolation layer STI may include a dielectric material. In an implementation, the device isolation layer STI may include an oxide.

Gate structures 150 may extend in the first direction D1. The gate structures 150 may be arranged in the second direction D2. The gate structure 150 may be on the device isolation layer STI and the active patterns AP. The gate structure 150 may be a buried gate structure that is buried in the active patterns AP and the device isolation layer STI. The active patterns AP may include impurity regions. The gate structure 150 and the active patterns AP may define a cell transistor.

The gate structure 150 may include a gate dielectric layer 152 on the active pattern AP, a gate electrode 151 on the gate dielectric layer 152, and a gate capping layer 153 on the gate electrode 151. The gate dielectric layer 152 and the gate capping layer 153 may include a dielectric material. In an implementation, the gate dielectric layer 152 may include an oxide, and the gate capping layer 153 may include a nitride. The gate electrode 151 may include a conductive material.

The active pattern AP may include a first part and two second parts. The first part of the active pattern AP may be between the two second parts of the active pattern AP. The gate structure 150 may be between the first part and the second part of the active pattern AP. The gate structure 150 may separate the first and second parts of the active pattern AP from each other.

Dielectric patterns 121 may be on the gate structure 150 and the device isolation layer STI. The dielectric pattern 121 may include a dielectric material. In an implementation, the dielectric pattern 121 may include a plurality of dielectric layers.

Bit-line structures 130 may extend in the second direction D2. The bit-line structures 130 may be arranged in the first direction D1. The bit-line structure 130 may be on the dielectric pattern 121 and the active pattern AP. The bit-line structure 130 may be electrically connected to the active pattern AP.

Each of the bit-line structures 130 may include bit-line contacts 131, first conductive layers 132, a second conductive layer 133, a third conductive layer 134, a bit-line capping layer 136, and a bit-line spacer 137.

The bit-line contacts 131 of the bit-line structure 130 may be arranged in the second direction D2. The first conductive layers 132 of the bit-line structure 130 may be arranged in the second direction D2. The bit-line contacts 131 and the first conductive layers 132 of the bit-line structure 130 may alternate with each other along the second direction D2. The bit-line contact 131 may be on the first part of the active pattern AP. The bit-line contact 131 may penetrate the dielectric pattern 121. The first conductive layer 132 may be on the dielectric pattern 121. The bit-line contact 131 and the first conductive layer 132 may include a conductive material. In an implementation, the bit-line contact 131 and the first conductive layer 132 may include polysilicon. In an implementation, the bit-line contacts 131 and the first conductive layers 132 included in one bit-line structure 130 may be connected to have a single unitary structure with no boundary therebetween.

The second conductive layer 133 may be on the bit-line contacts 131 and the first conductive layers 132. The third conductive layer 134 may be on the second conductive layer 133. The bit-line capping layer 136 may be on the third conductive layer 134. The second conductive layer 133 and the third conductive layer 134 may include a conductive material. In an implementation, the second conductive layer 133 may include polysilicon, and the third conductive layer 134 may include a metal. The bit-line capping layer 136 may include a dielectric material. In an implementation, the bit-line capping layer 136 may include a nitride. In an implementation, the number of conductive layers included in one bit-line structure 130 may be greater or less than that shown. As used herein, the terms "first," "second," and the like are merely for identification and differentiation, and are not intended to imply or require sequential inclusion (e.g., a third element and a fourth element may be described without implying or requiring the presence of a first element or second element).

The bit-line spacer 137 may cover a top surface and a sidewall of the bit-line capping layer 136, sidewalls of the first, second, and third conductive layers 132, 133, and 134, and sidewalls of the bit-line contacts 131. The bit-line spacer 137 may include a dielectric material. In an implementation, the bit-line spacer 137 may include a plurality of dielectric layers.

Storage node contacts BC may be provided. The storage node contact BC may be on the active pattern AP. The storage node contact BC may be between neighboring bit-line structures 130. The storage node contact BC may be on a sidewall of the bit-line structure 130. The storage node contact BC may include a conductive material. In an implementation, the storage node contact BC may include polysilicon.

Landing pads LP may be provided. The landing pad LP may be on the storage node contact BC. The landing pad LP may include a conductive material. In an implementation, the landing pad LP may include a metal. In an implementation, a metal silicide layer and a barrier layer may be between the storage node contact BC and the landing pad LP.

The landing pad LP may include an upper part LP_U and a lower part LP_L. The upper part LP_U of the landing pad LP may be a portion at a higher level than (e.g., farther from the substrate 100 in the third direction D3 than) that of the bit-line structure 130. The lower part LP_L of the landing pad LP may be a portion connected to the storage node contact BC. The upper part LP_U of the landing pad LP may be on the lower part LP_L of the landing pad LP (e.g., the lower part LP_L of the landing pad LP may be between the substrate 100 and the upper part LP_U of the landing pad LP in the third direction D3). A portion of the upper part LP_U of the landing pad LP may overlap, in the third direction D3, with a portion of the storage node contact BC.

Dielectric fences 240 may be provided. The dielectric fence 240 may be on the gate capping layer 153 of the gate structure 150. The dielectric fence 240 may be between the storage node contacts BC that are adjacent to each other in the second direction D2. The dielectric fence 240 may be between the bit-line structures 130 that are adjacent to each other in the first direction D1. The dielectric fence 240 may include a dielectric material.

A filling pattern 250 may be on the dielectric fence 240. The filling pattern 250 may separate the landing pads LP from each other. The filling pattern 250 may surround the landing pad LP. The filling pattern 250 may include a dielectric material.

Data storage patterns DSP may be provided. The data storage pattern DSP may be electrically connected to the active pattern AP through the landing pad LP and the storage node contact BC. In an implementation, each of the data storage patterns DSP may be a capacitor including a bottom electrode, a dielectric layer, and a top electrode. In an implementation, the semiconductor device including the data storage patterns DSP may be a dynamic random access memory (DRAM). In an implementation, each of the data storage patterns DSP may include a magnetic tunnel junction pattern. In an implementation, the semiconductor device including the data storage patterns DSP may be a magnetic random access memory (MRAM). In an implementation, the data storage patterns DSP may include a phase change material or a variable resistance material. In an implementation, the semiconductor device including the data storage patterns DSP may be a phase change random access memory (PRAM) or a resistive random access memory (ReRAM). In an implementation, each of the data storage patterns DSP may include various materials and/or structures capable of storage data.

Referring to FIG. 1C, e.g., in a plan view, the upper part LP_U of the landing pad LP may include a first pad flat sidewall PF1, a second pad flat sidewall PF2 opposite to the first pad flat sidewall PF1, a third pad flat sidewall PF3, and a fourth pad flat sidewall PF4 opposite to the third pad flat sidewall PF3. The third pad flat sidewall PF3 may be between the first and second pad flat sidewalls PF1 and PF2. The fourth pad flat sidewall PF4 may be between the first and second pad flat sidewalls PF1 and PF2. The upper part LP_U of the landing pad LP may be flat on or at the first, second, third, and fourth pad flat sidewalls PF1, PF2, PF3, and PF4. The first and second pad flat sidewalls PF1 and PF2 of the upper part LP_U of the landing pad LP may extend (e.g., lengthwise) in the first direction D1. The first and second pad flat sidewalls PF1 and PF2 of the upper part LP_U of the landing pad LP may be parallel to each other.

The third and fourth pad flat sidewalls PF3 and PF3 of the upper part LP_U of the landing pad LP may extend (e.g., lengthwise) in a fourth direction D4. The third and fourth pad flat sidewalls PF3 and PF4 of the upper part LP_U of the landing pad LP may be parallel to each other.

The upper part LP_U of the landing pad LP may further include a first pad curved sidewall PC1 between the first and third pad flat sidewalls PF1 and PF3, a second pad curved sidewall PC2 between the first and fourth pad flat sidewalls PF1 and PF4, a third pad curved sidewall PC3 between the second and third pad flat sidewalls PF2 and PF3, and a fourth pad curved sidewall PC4 between the second and fourth pad flat sidewalls PF2 and PF4. The upper part LP_U of the landing pad LP may be curved on or at the first, second, third, and fourth pad curved sidewalls PC1, PC2, PC3, and PC4.

The first pad curved sidewall PC1 may be connected to the first and third pad flat sidewalls PF1 and PF3, the second pad curved sidewall PC2 may be connected to the first and fourth pad flat sidewalls PF1 and PF4, the third pad curved sidewall PC3 may be connected to the second and third pad flat sidewalls PF2 and PF3, and the fourth pad curved sidewall PC4 may be connected to the second and fourth pad flat sidewalls PF2 and PF4.

A distance L1 between the first and fourth pad curved sidewalls PC1 and PC4 of the upper part LP_U of the landing pad LP (e.g., a maximum distance between an apex of the first pad curved sidewall PC1 and an apex of the fourth pad curved sidewall PC4) may be greater than a distance L2 between the second and third pad curved sidewalls PC2 and PC3 of the upper part LP_U of the landing pad LP (e.g., a maximum distance between an apex of the second pad curved sidewall PC2 and an apex of the third pad curved sidewall PC3).

In the semiconductor device according to some embodiments, the upper part LP_U of the landing pad LP may have a shape including the first, second, third, and fourth pad flat sidewalls PF1, PF2, PF3, and PF4 and the first, second, third, and fourth pad curved sidewalls PC1, PC2, PC3, and PC4, and it may be possible to sufficiently secure an area for the upper and lower parts LP_U and LP_L of the landing pad LP while satisfactorily obtaining a distance between the upper parts LP_U of neighboring landing pads LP. Accordingly, it may be possible to help prevent separation between the upper and lower parts LP_U and LP_L of the landing pad LP and to help prevent an undesired electrical connection between the upper parts LP_U of the landing pads LP. In an implementation, there may be a reduction in the degree of difficulty in patterning the upper parts LP_U of the landing pads LP.

FIGS. 2, 3, 4, 5, 6A, 6B, 7A, 7B, 8A, 8B, 9A, 9B, 9C, 10A, 10B, 10C, 11A, 11B, and 11C illustrate stages in a method of fabricating a semiconductor device depicted in FIGS. 1A to 1C. FIGS. 2, 3, 4, 5, 6B, 7B, 8B, 9B, 10B, and 11B may correspond to FIG. 1B. FIGS. 6A, 7A, 8A, 9A, 10A, and 11A may correspond to FIG. 1A. FIGS. 9C, 10C, and 11C may correspond to FIG. 1C.

Figure 2:
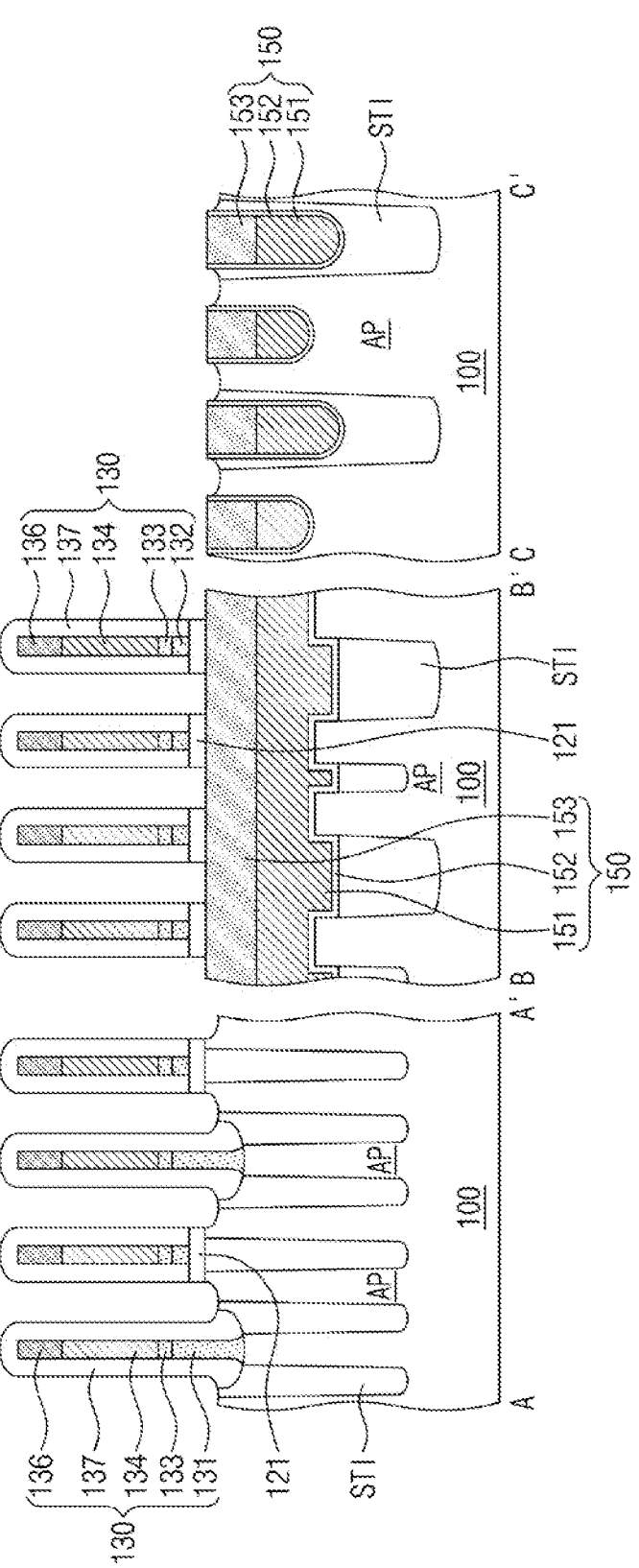

Referring to FIG. 2, a device isolation layer STI may be formed in a substrate 100. The device isolation layer STI may be formed to define active patterns AP. Gate structures 150 may be formed to extend in the first direction (see D1 of FIG. 1) on the active patterns AP. The dielectric patterns 121 and bit-line structures 130 may be formed on the gate structure 150 and the device isolation layer STI, and the bit-line structures 130 may extend in a second direction (see D2 of FIG. 1).

Figure 3:
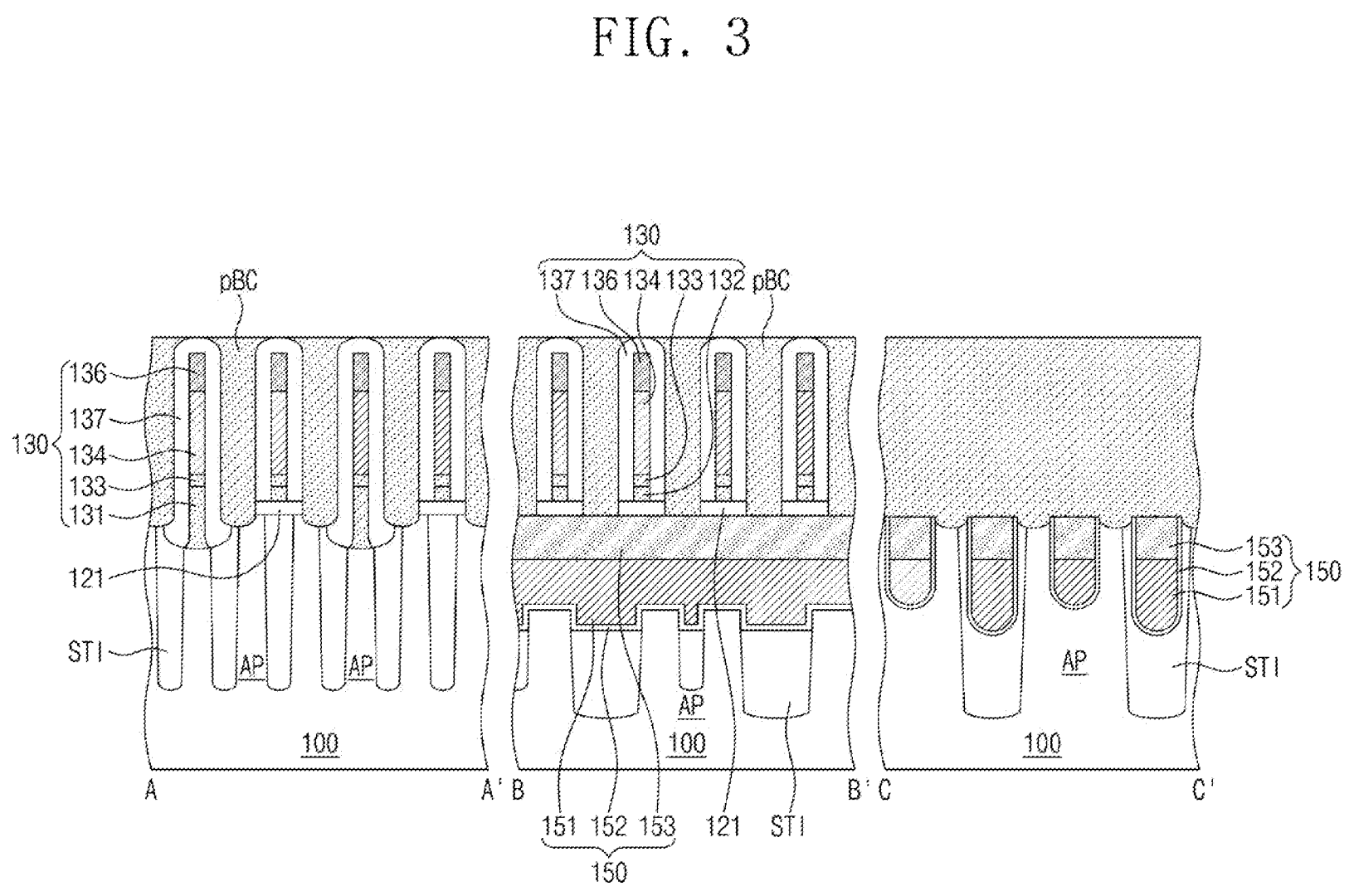

Referring to FIG. 3, one or more preliminary contact layers pBC may be formed. The preliminary contact layer pBC may be formed between neighboring bit-line structures 130. The preliminary contact layer pBC may extend in the second direction D2. The preliminary contact layers pBC may be arranged to be spaced apart from each other in the first direction D1. The preliminary contact layer pBC may include a conductive material. In an implementation, the preliminary contact layer pBC may include polysilicon.

Figure 4:
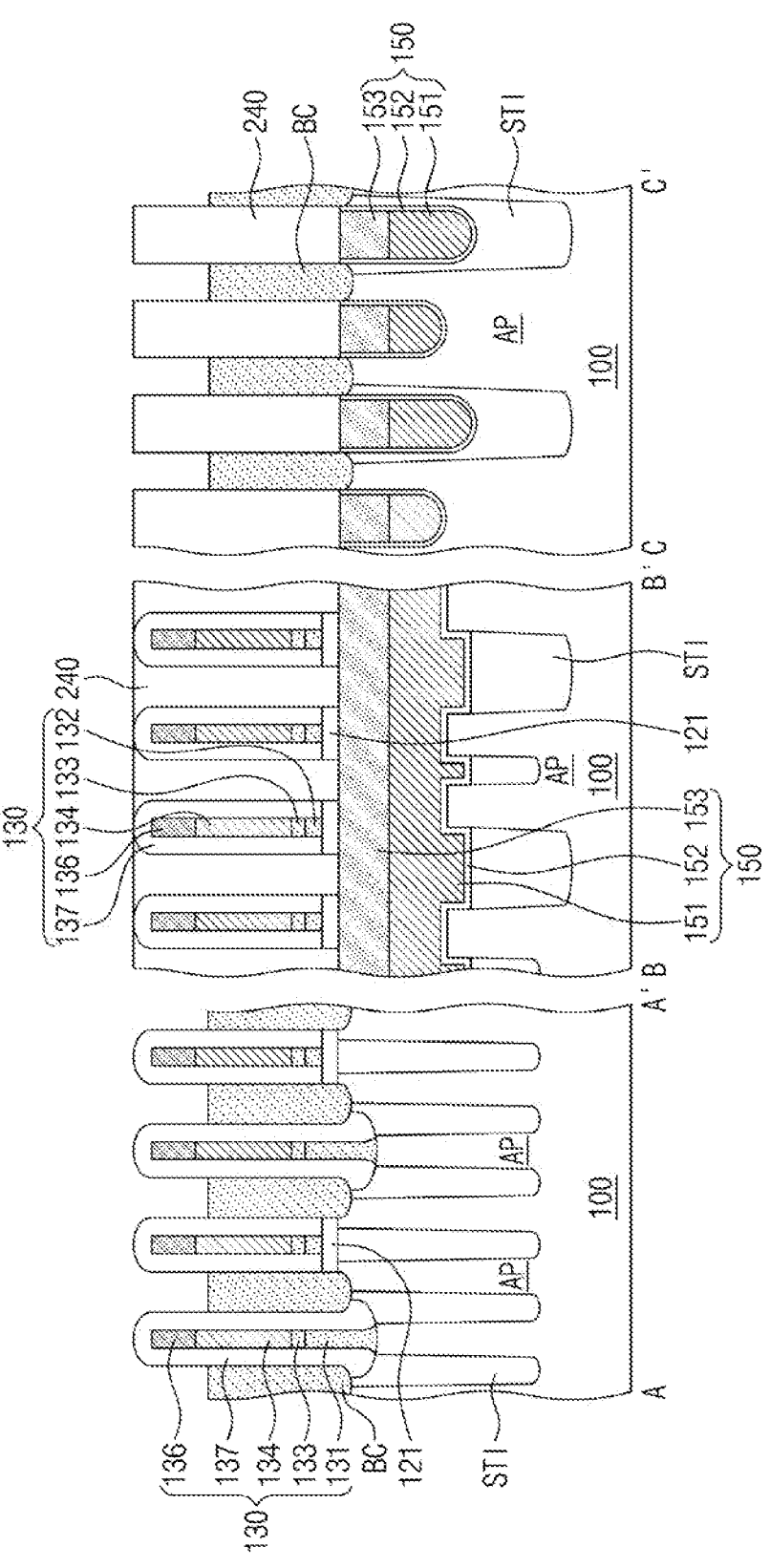

Referring to FIG. 4, the preliminary contact layers pBC may be formed. As the preliminary contact layer pBC is etched, the preliminary contact layer pBC may be divided into storage node contacts BC.

Dielectric fences 240 may be formed. The dielectric fence 240 may be formed between neighboring bit-line structures 130. The dielectric fence 240 may be formed between neighboring storage node contacts BC.

After the formation of the dielectric fences 240, a process may be performed to etch the storage node contact BC. As the process is performed to etch the storage node contact BC, an upper part of the storage node contact BC may be removed.

Figure 5:
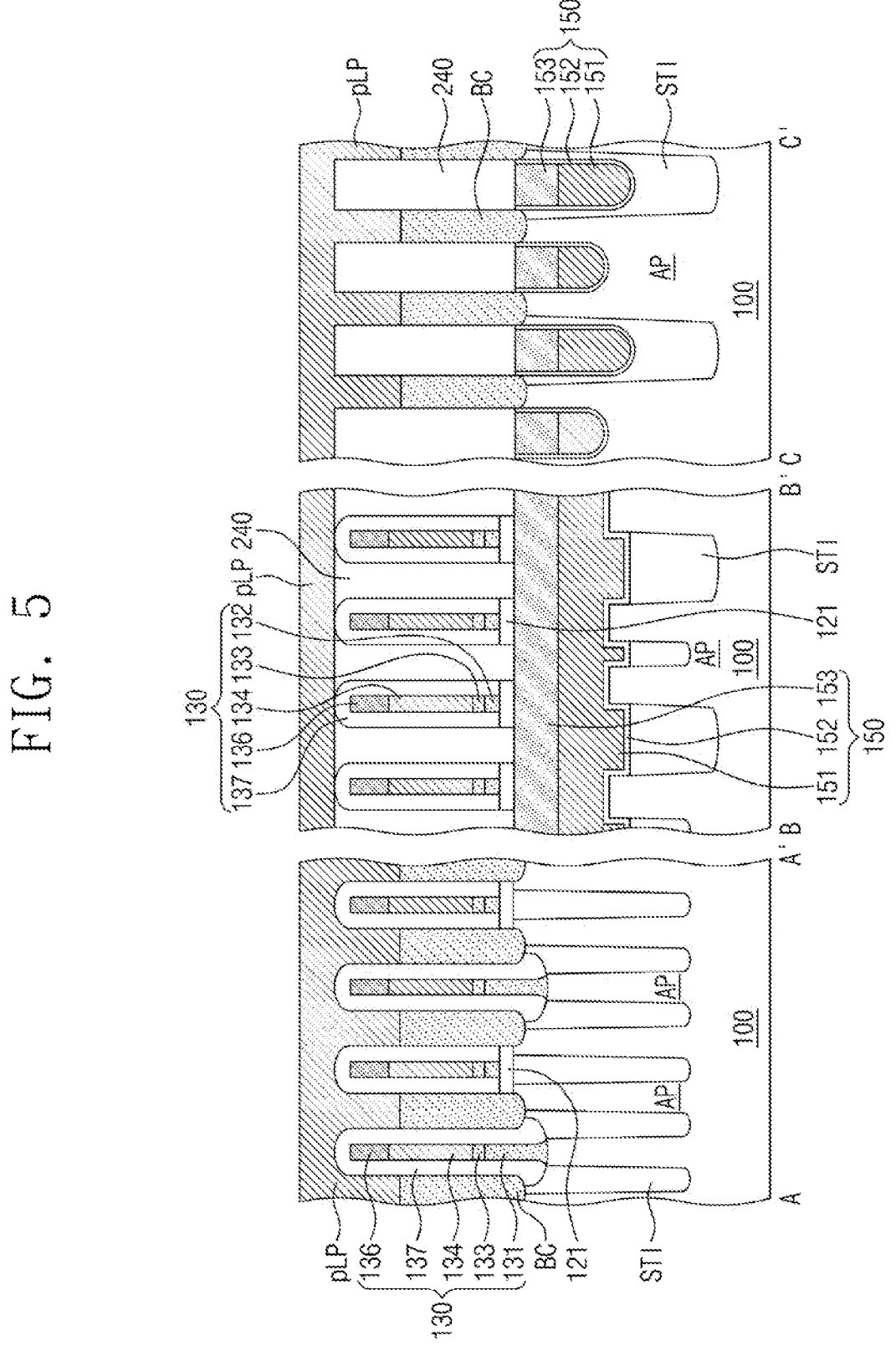

Referring to FIG. 5, a preliminary pad layer pLP may be formed. The preliminary pad layer pLP may cover the bit-line structures 130, the dielectric fences 240, and the storage node contacts BC. The preliminary pad layer pLP may include a conductive material. In an implementation, the preliminary pad layer pLP may include a metal.

Figure 6A:
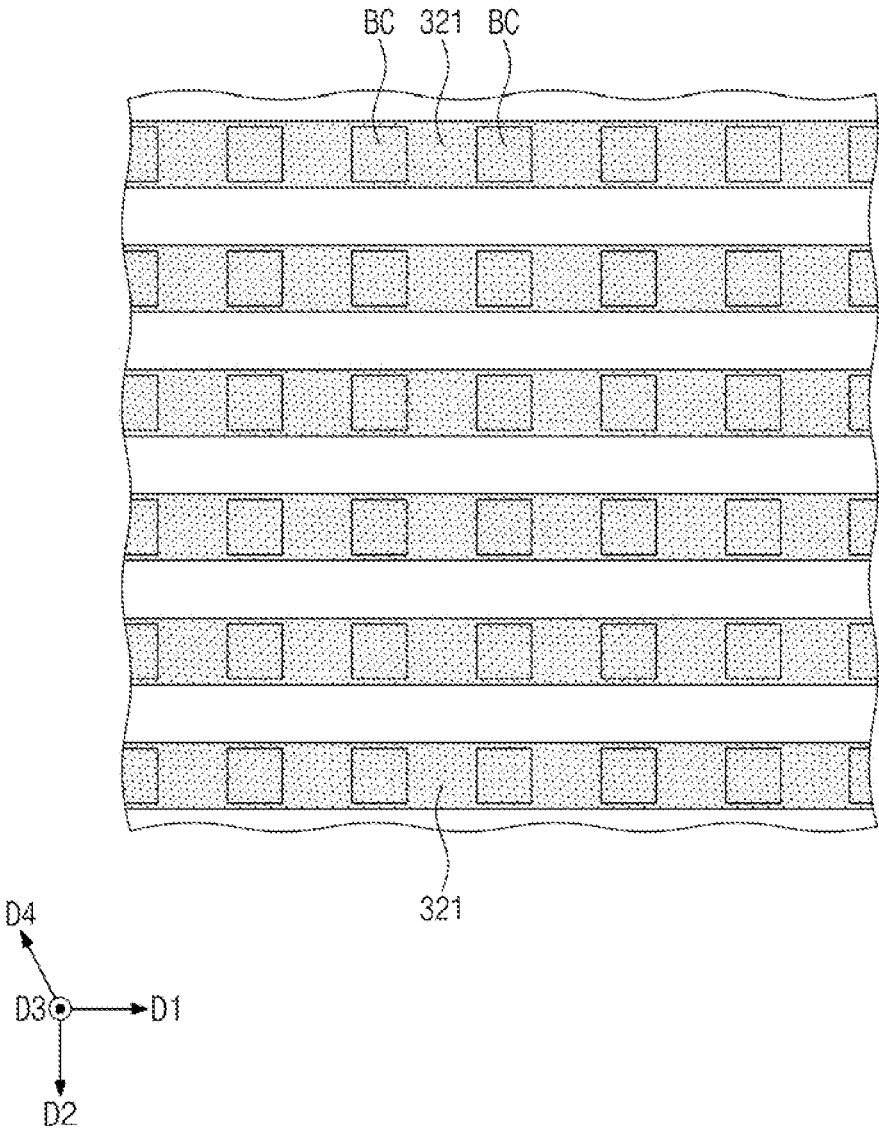
Figure 6B:
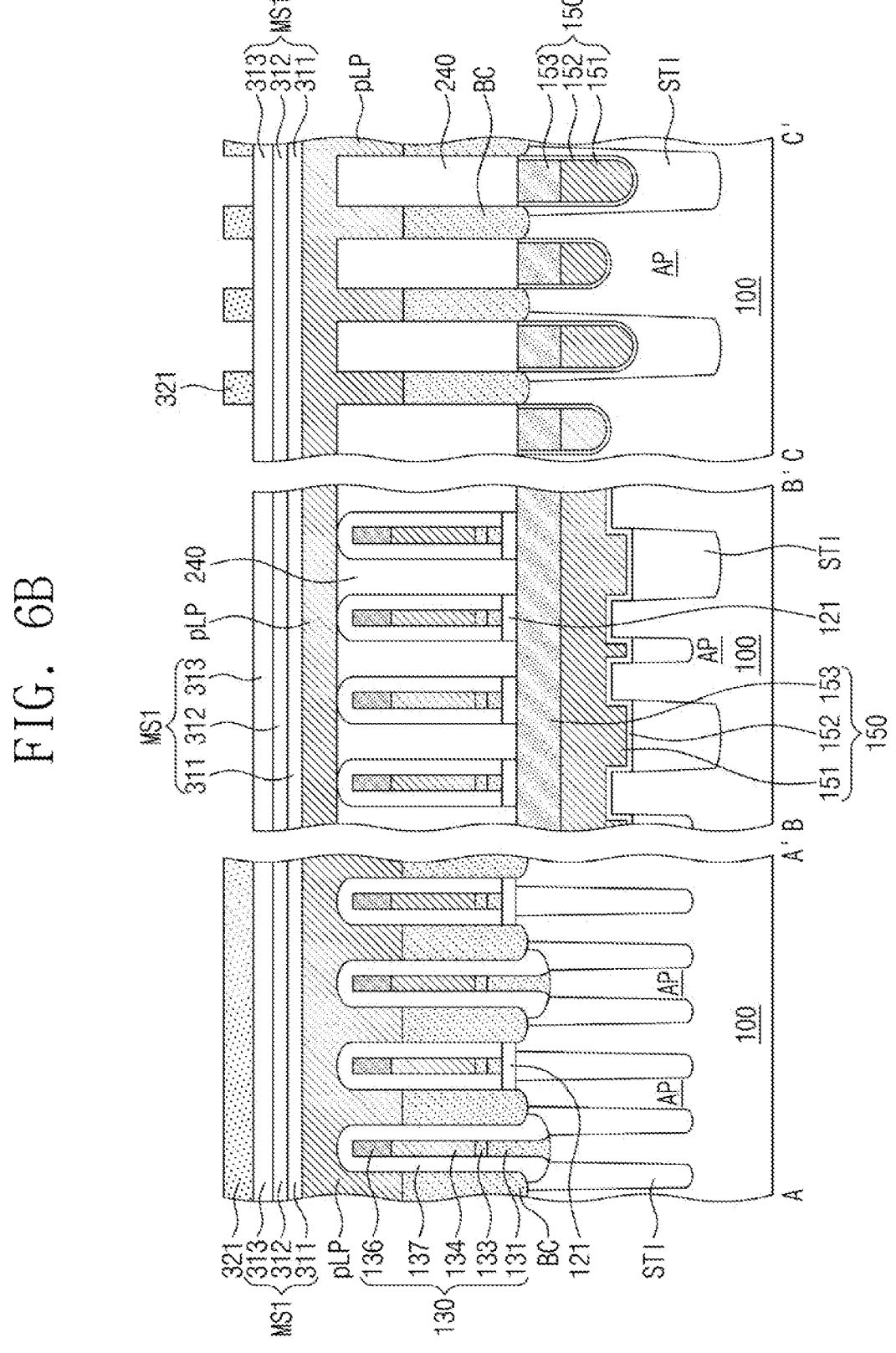

Referring to FIGS. 6A and 6B, a first mask structure MS1 may be formed on the preliminary pad layer pLP. The first mask structure MS1 may include a base mask layer 311 on the preliminary pad layer pLP, a first mask layer 312 on the base mask layer 311, and a second mask layer 313 on the first mask layer 312. In an implementation, the number of mask layers included in the first mask structure MS1 may be greater or less than that shown.

The base mask layer 311, the first mask layer 312, and the second mask layer 313 may include a material for performing an etching process. The base mask layer 311 may include, e.g., a spin-on-hardmask (SOH) layer or an amorphous carbon layer (ACL). In an implementation, the first mask layer 312 may include an oxynitride, e.g., silicon oxynitride may be the oxynitride included in the first mask layer 312. In an implementation, the second mask layer 313 may include an oxide, e.g., silicon oxide may be the oxide included in the second mask layer 313.

First mask lines 321 may be formed on the first mask structure MS1. The first mask lines 321 may extend in the first direction D1. The first mask lines 321 may be arranged in the second direction D2. In an implementation, the first mask line 321 may overlap in the third direction (see D3 of FIG. 1) with a plurality of storage node contacts BC. The first mask lines 321 may include, e.g., a photoresist material or a carbon-containing organic material.

Figure 7A:
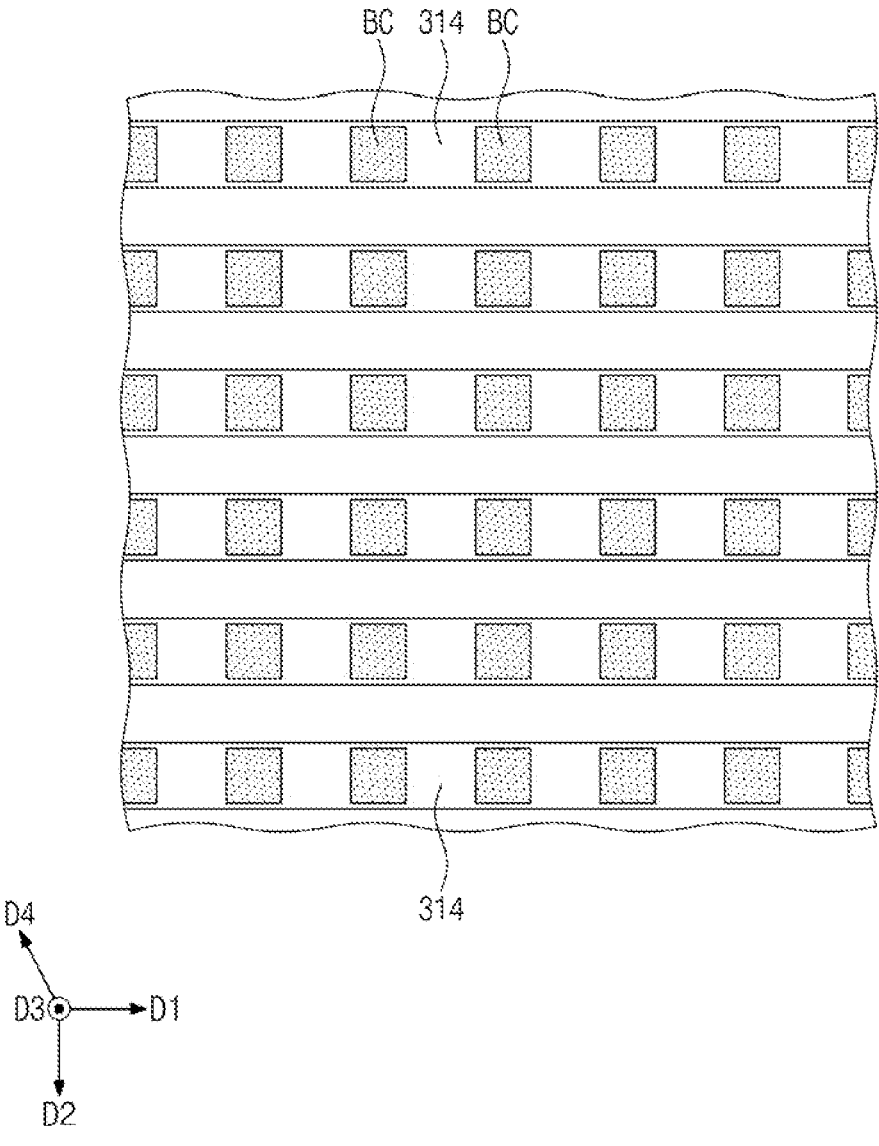
Figure 7B:
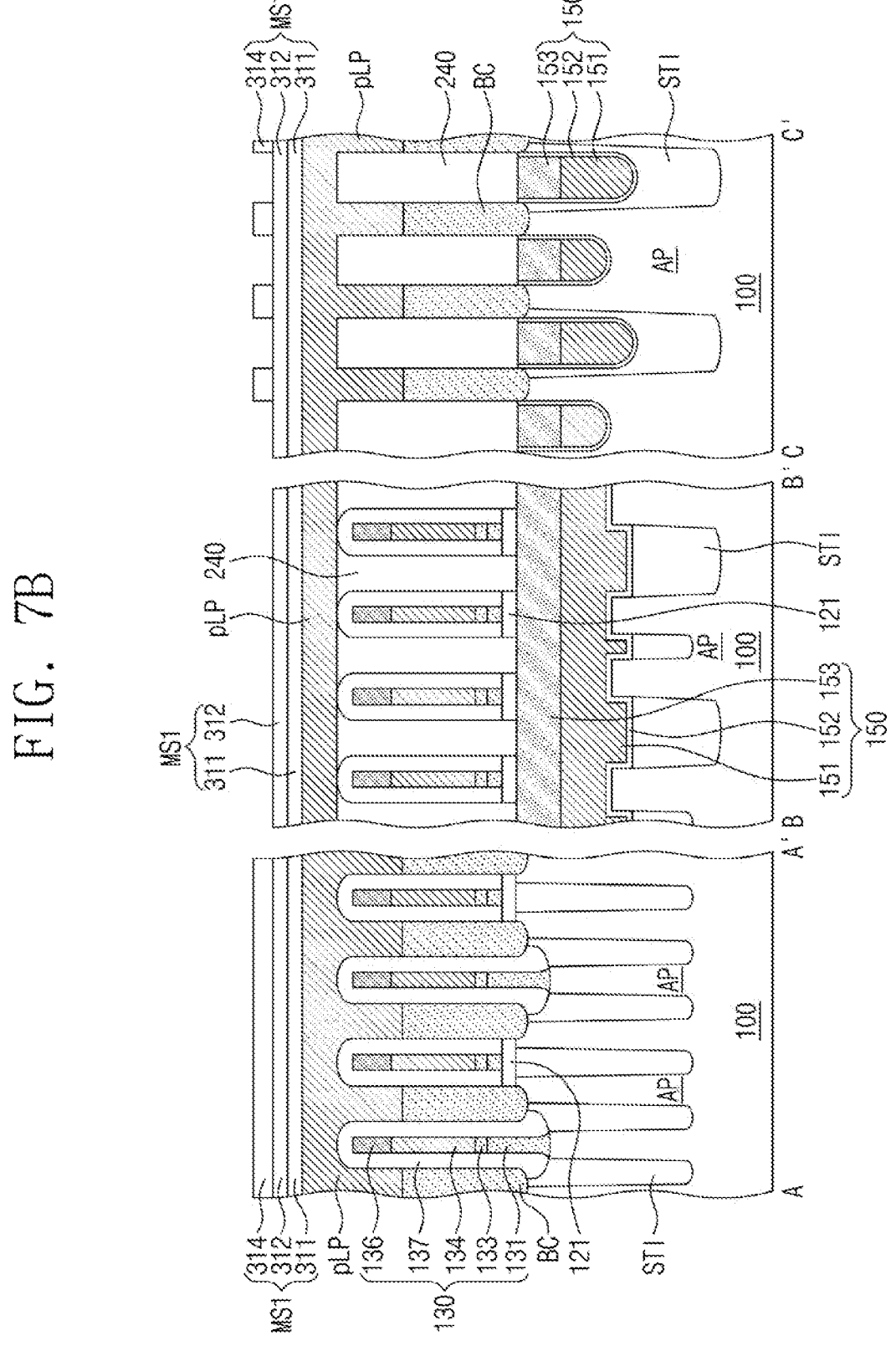

Referring to FIGS. 7A and 7B, the first mask lines 321 may be used as an etching mask to perform an etching process. The etching process may etch the second mask layer 313 of the first mask structure MS1. The etching of the second mask layer 313 may form second mask lines 314. The second mask lines 314 may extend in the first direction D1. The second mask lines 314 may be arranged in the second direction D2. The first mask lines 321 may be removed in a subsequent process.

Figure 8A:
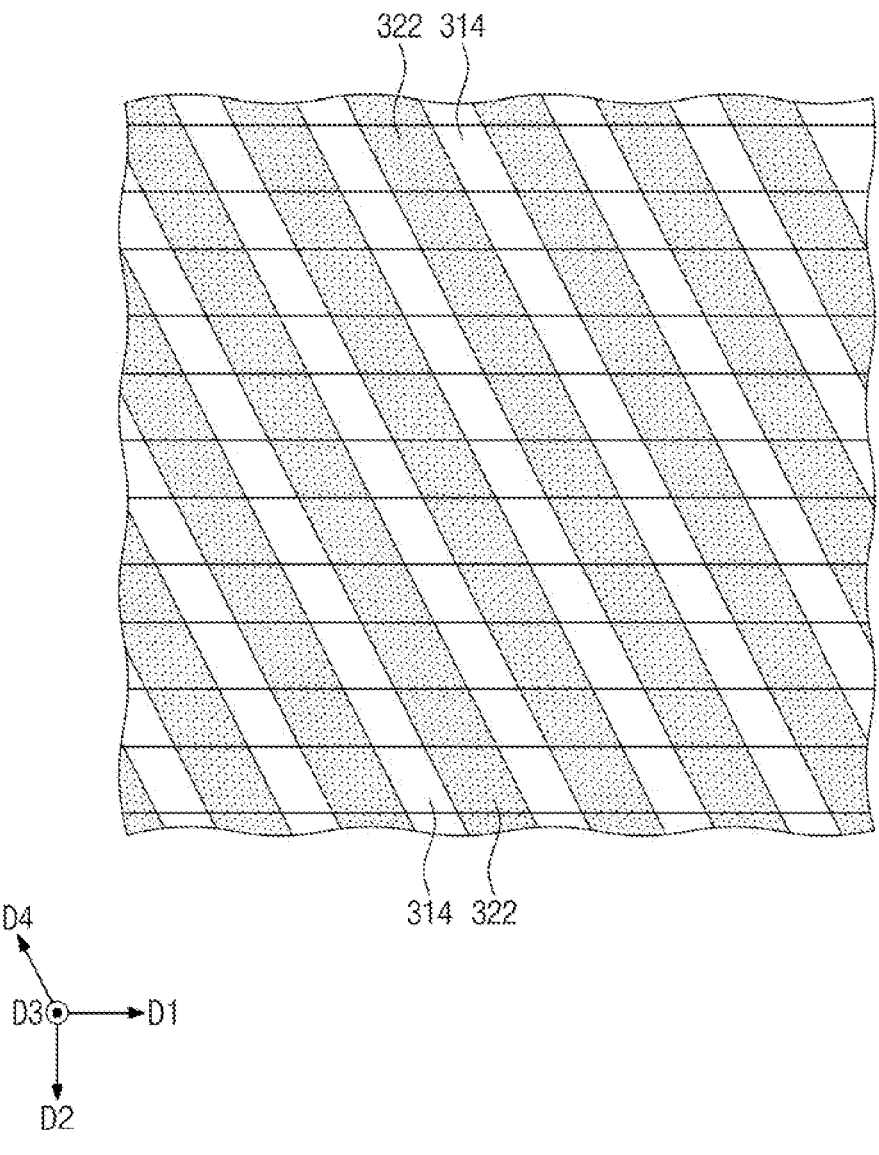
Figure 8B:
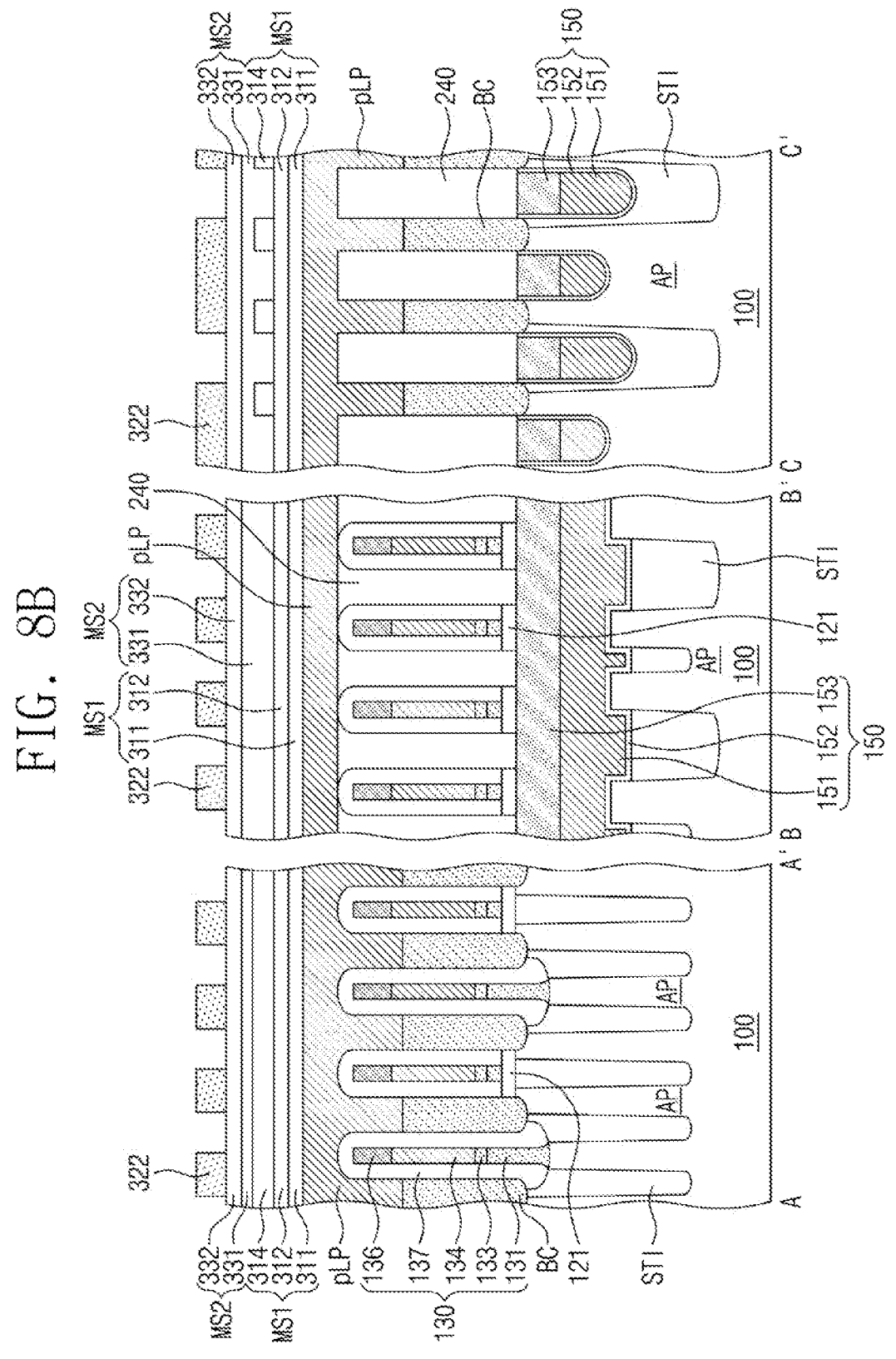

Referring to FIGS. 8A and 8B, a second mask structure MS2 may be formed on the first mask structure MS1. The second mask structure MS2 may include a third mask layer 331 that covers the second mask lines 314 of the first mask structure MS1 and a fourth mask layer 332 on the third mask layer 331. In an implementation, the number of mask layers included in the second mask structure MS2 may be greater or less than that shown.

The third and fourth mask layers 331 and 332 may include a material for performing an etching process. The third mask layer 331 may include, e.g., a spin-on-hardmask (SOH) layer or an amorphous carbon layer (ACL). The fourth mask layer 332 may include an oxynitride, e.g., silicon oxynitride may be the oxynitride included in the fourth mask layer 332.

Third mask lines 322 may be formed on the second mask structure MS2. The third mask lines 322 may extend in a fourth direction (see D4 of FIG. 1). The fourth direction D4 may intersect the first direction D1, the second direction D2, and the third direction D3. In an implementation, the fourth direction D4 may be a horizontal direction that intersects the first direction D1 and the second direction D2 and is perpendicular to the third direction D3. The third mask lines 322 may intersect the gate structures 150, the bit-line structures 130, the first mask lines 321, and the second mask lines 314. The third mask lines 322 may extend oblique with respect to the gate structures 150, the bit-line structures 130, the first mask lines 321, and the second mask lines 314. The third mask lines 322 may include, e.g., a photoresist material or a carbon-containing organic material.

Figure 9A:
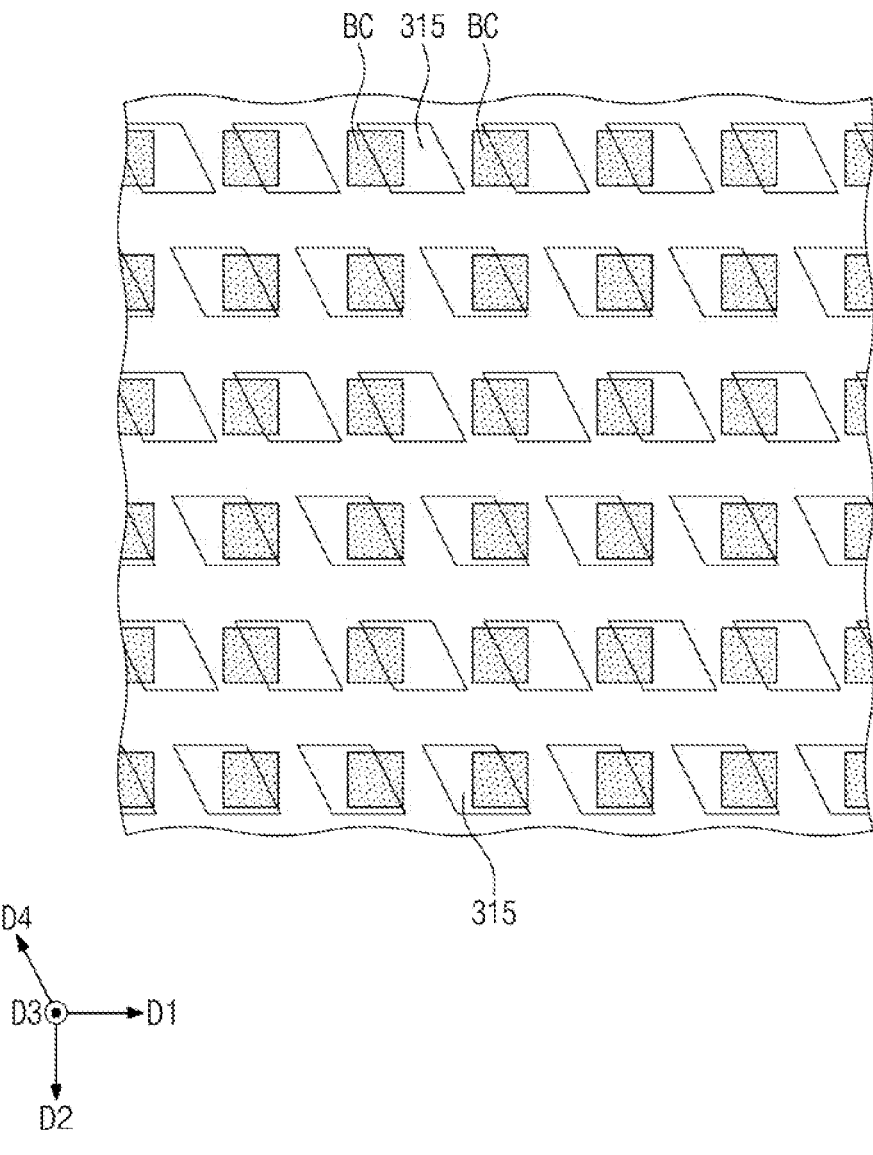
Figure 9B:
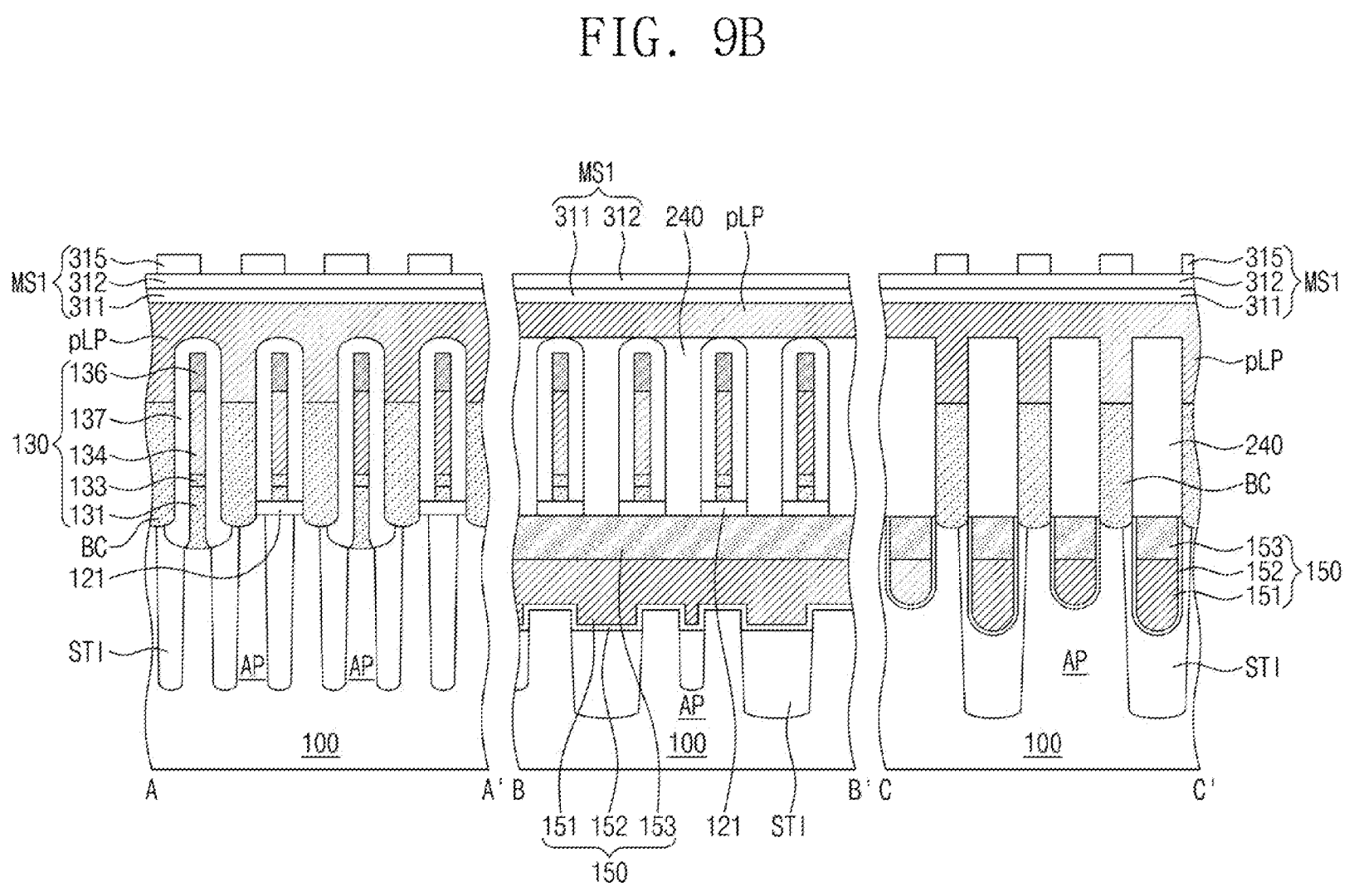
Figure 9C:
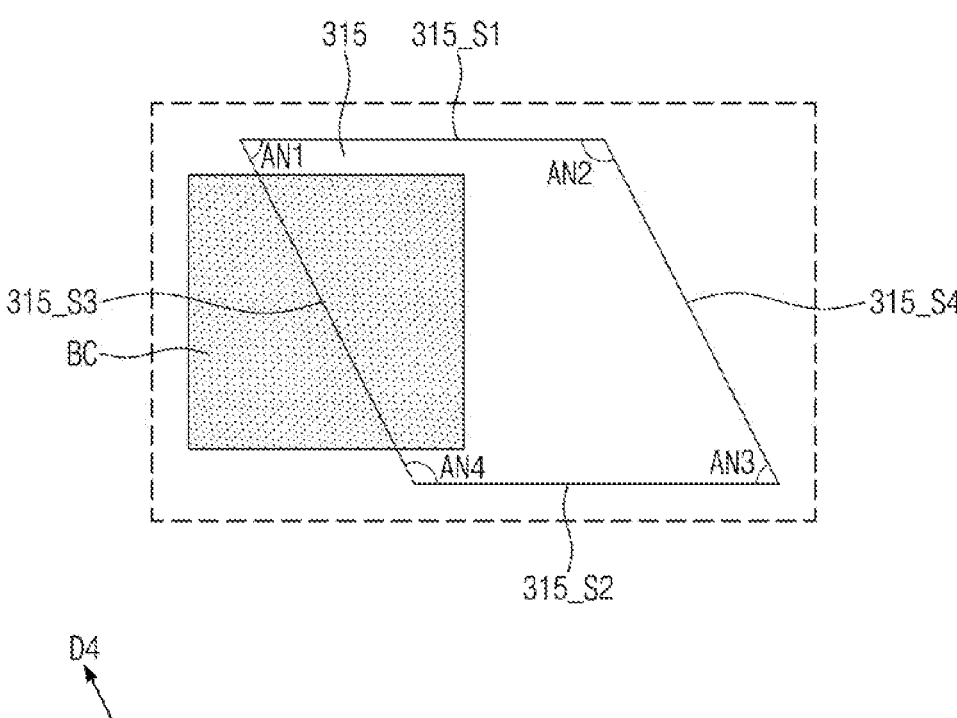

Referring to FIGS. 9A and 9B, etching process may be performed in which the third mask lines 322 are used as an etching mask. In the etching process, the fourth mask layer 332 of the second mask structure MS2 may be etched to form fourth mask lines. The fourth mask lines may be used as an etching mask to perform an etching process. In the etching process, the third mask layer 331 may be etched to form fifth mask lines. The fifth mask lines may be used as an etching mask to perform an etching process. In the etching process, the second mask lines 314 of the first mask structure MS1 may be etched to form first mask patterns 315. The third mask lines 322 may be removed in a subsequent process.

In an implementation, the third mask lines 322 may be used as an etching mask to simultaneously etch the fourth mask layer 332, the third mask layer 331, and the second mask lines 314.

Referring to FIG. 9C, the first mask pattern 315 may have a parallelogram shape. The first mask pattern 315 may have a first sidewall 315_S1, a second sidewall 315_S2 opposite to the first sidewall 315_S1, a third sidewall 315_S3, and a fourth sidewall 315_S4 opposite to the third sidewall 315_S3. The first mask pattern 315 may be flat on or at the first, second, third, and fourth sidewalls 315_S1, 315_S2, 315_S3, and 315_S4. The first sidewall 315_S1 of the first mask pattern 315 may be connected to the third and fourth sidewalls 315_S3 and 315_S4 of the first mask pattern 315. The second sidewall 315_S2 of the first mask pattern 315 may be connected to the third and fourth sidewalls 315_S3 and 315_S4 of the first mask pattern 315. The first and second sidewalls 315_S1 and 315_S2 of the first mask pattern 315 may extend in the first direction D1. The third and fourth sidewalls 315_S3 and 315_S4 of the first mask pattern 315 may extend in the fourth direction D4.

A first angle AN1 between the first and third sidewalls 315_S1 and 315_S3 of the first mask pattern 315 may be less than a second angle AN2 between the first and fourth sidewalls 315_S1 and 315_S4 of the first mask pattern 315. The first angle AN1 between the first and third sidewalls 315_S1 and 315_S3 of the first mask pattern 315 may be the same as a third angle AN3 between the second and fourth sidewalls 315_S2 and 315_S4 of the first mask pattern 315.

The second angle AN2 between the first and fourth sidewalls 315_S1 and 315_S4 of the first mask pattern 315 may be the same as a fourth angle AN4 between the second and third sidewalls 315_S2 and 315_S3 of the first mask pattern 315.

Figure 10A:
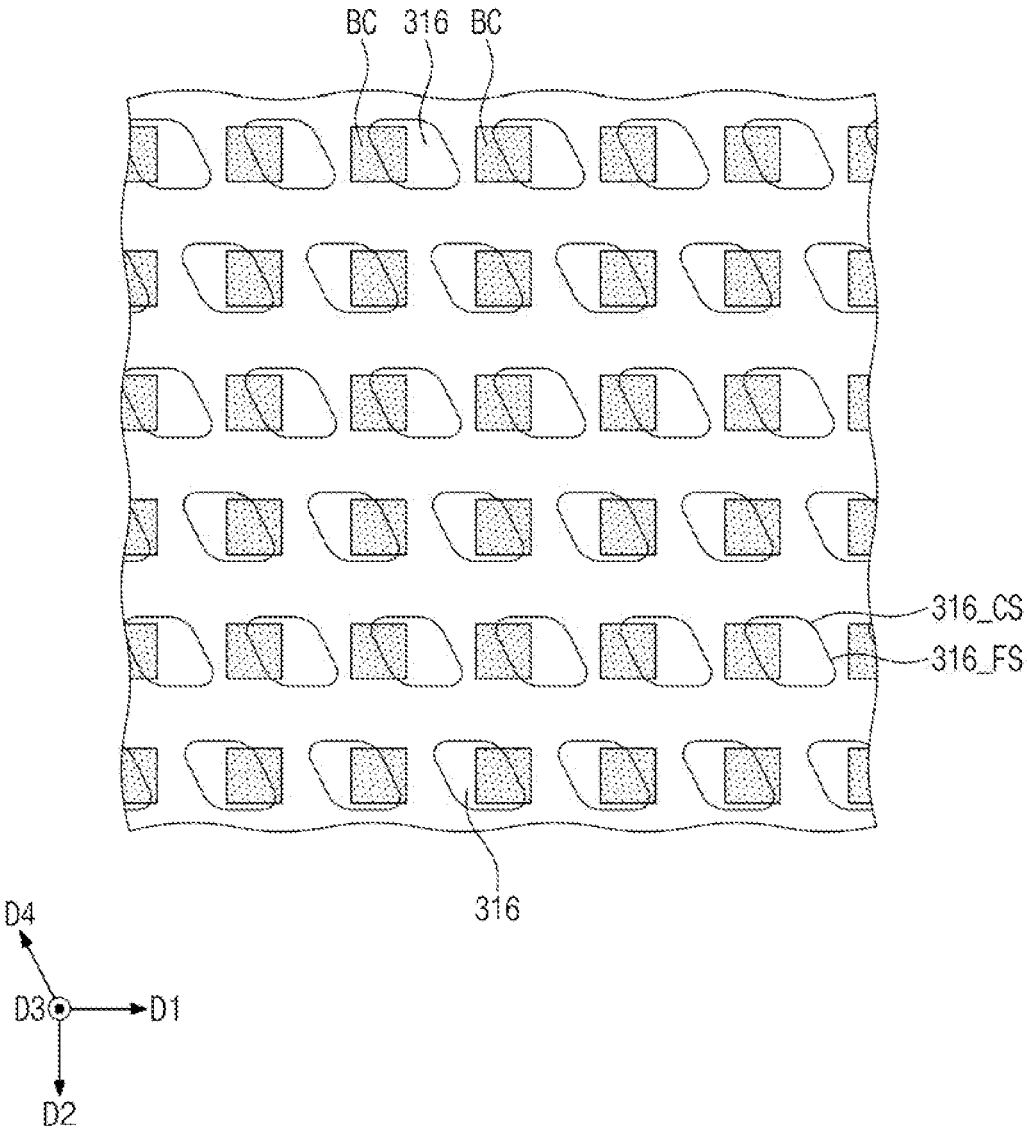
Figure 10B:
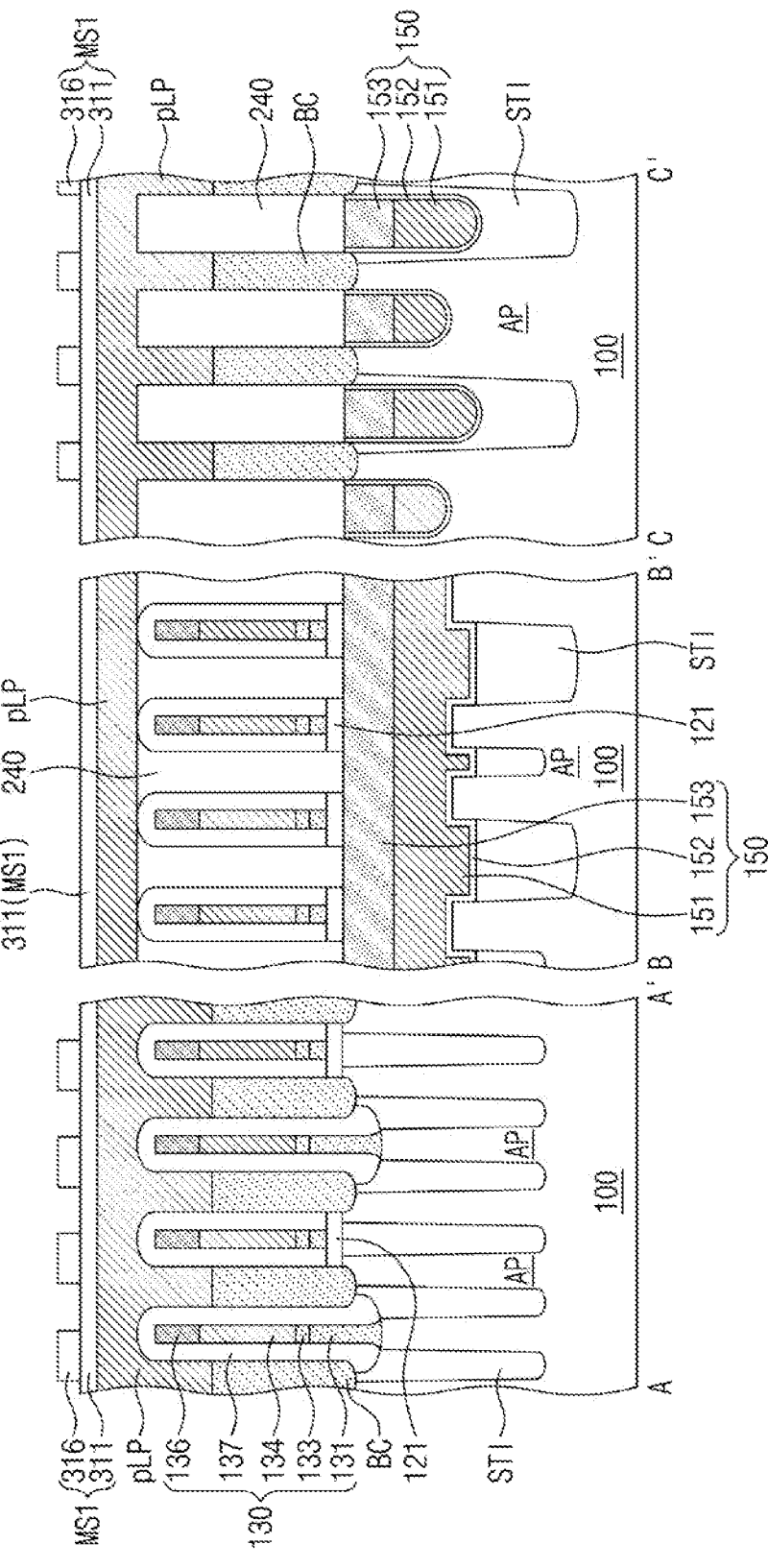
Figure 10C:
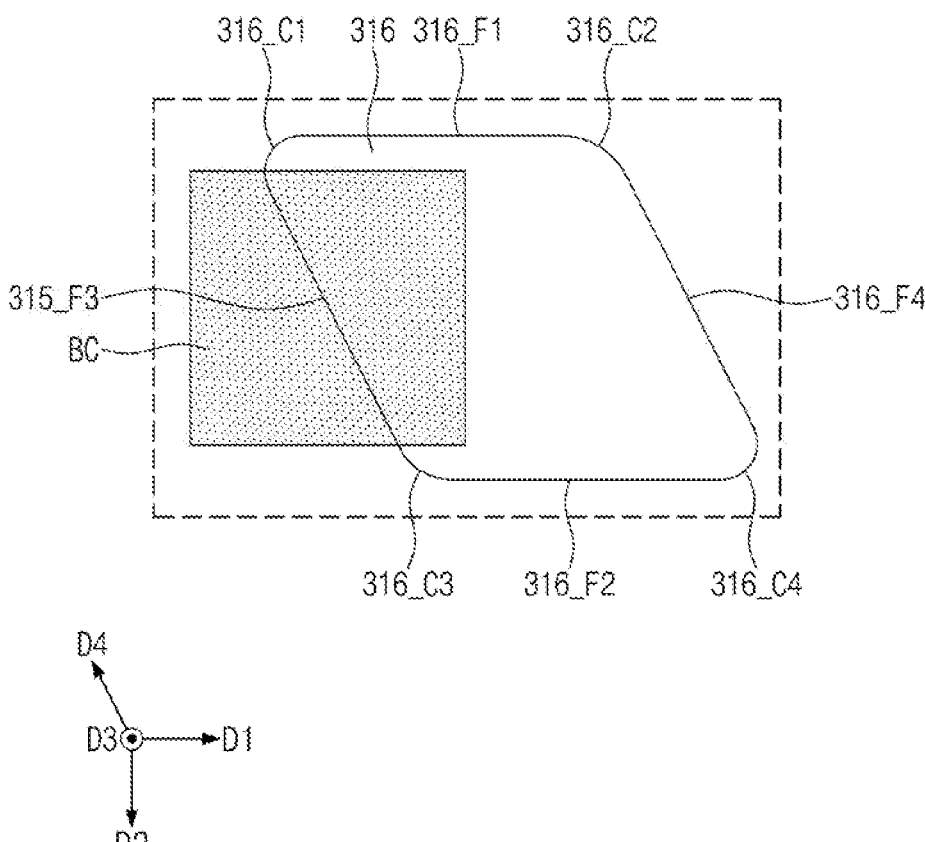

Referring to FIGS. 10A, 10B, and 10C, the first mask patterns 315 may be used as an etching mask to perform an etching process. In the etching process, the first mask layer 312 may be etched to form second mask patterns 316. The first mask patterns 315 may be removed in a subsequent process.

A shape of the first mask pattern 315 may be transferred to form the second mask pattern 316. The second mask pattern 316 may have a first mask flat sidewall 316_F1, a second mask flat sidewall 316_F2 opposite to the first mask flat sidewall 316_F1, a third mask flat sidewall 316_F3, and a fourth mask flat sidewall 316_F4 opposite to the third mask flat sidewall 316_F3. The second mask pattern 316 may be flat at the first, second, third, and fourth mask flat sidewalls 316_F1, 316_F2, 316_F3, and 316_F4. The first and second mask flat sidewalls 316_F1 and 316_F2 of the second mask pattern 316 may extend in the first direction D1. The third and fourth mask flat sidewalls 316_F3 and 316_F4 of the second mask pattern 316 may extend in the fourth direction D4.

The second mask pattern 316 may further include a first mask curved sidewall 316_C1 between the first and third mask flat sidewalls 316_F1 and 316_F3, a second mask curved sidewall 316_C2 between the first and fourth mask flat sidewalls 316_F1 and 316_F4, a third mask curved sidewall 316_C3 between the second and third mask flat sidewalls 316_F2 and 316_F3, and a fourth mask curved sidewall 316_C4 between the second and fourth mask flat sidewalls 316_F2 and 316_F4.

Figure 11A:
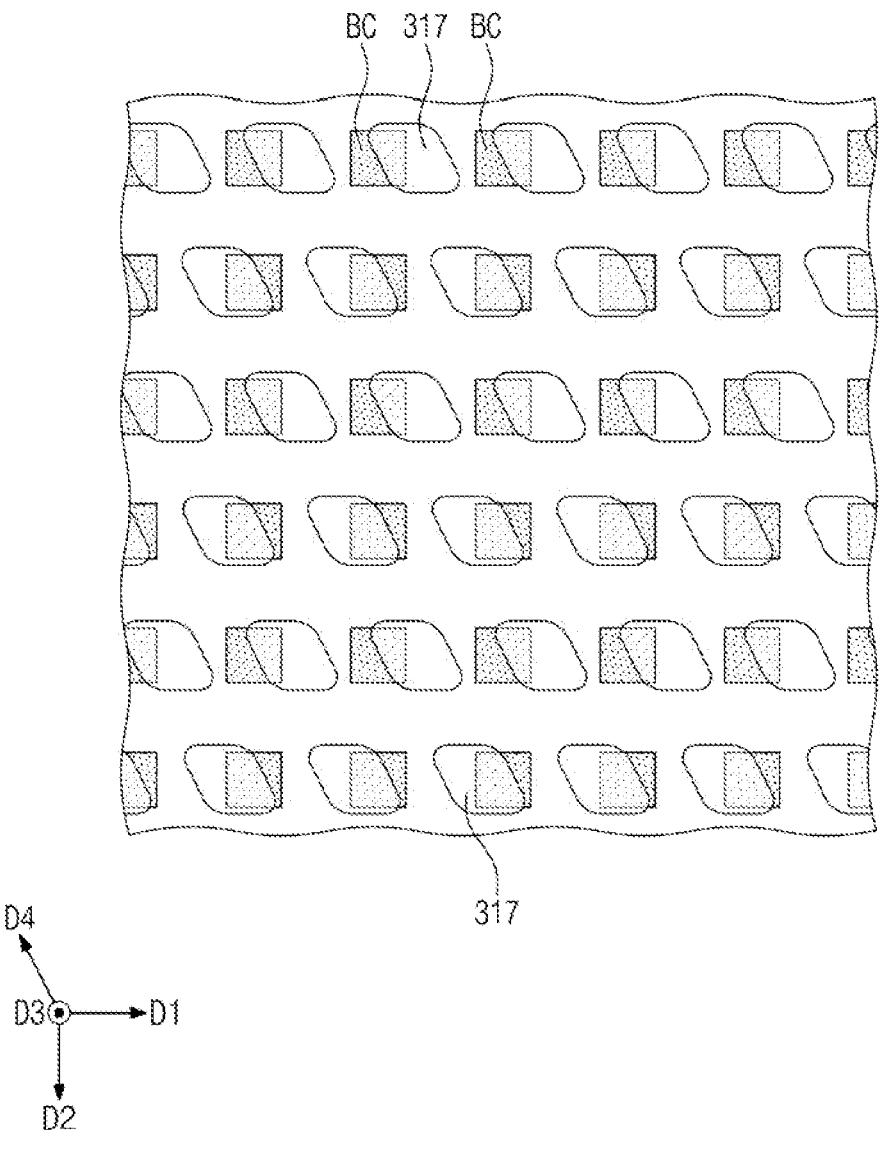
Figure 11B:
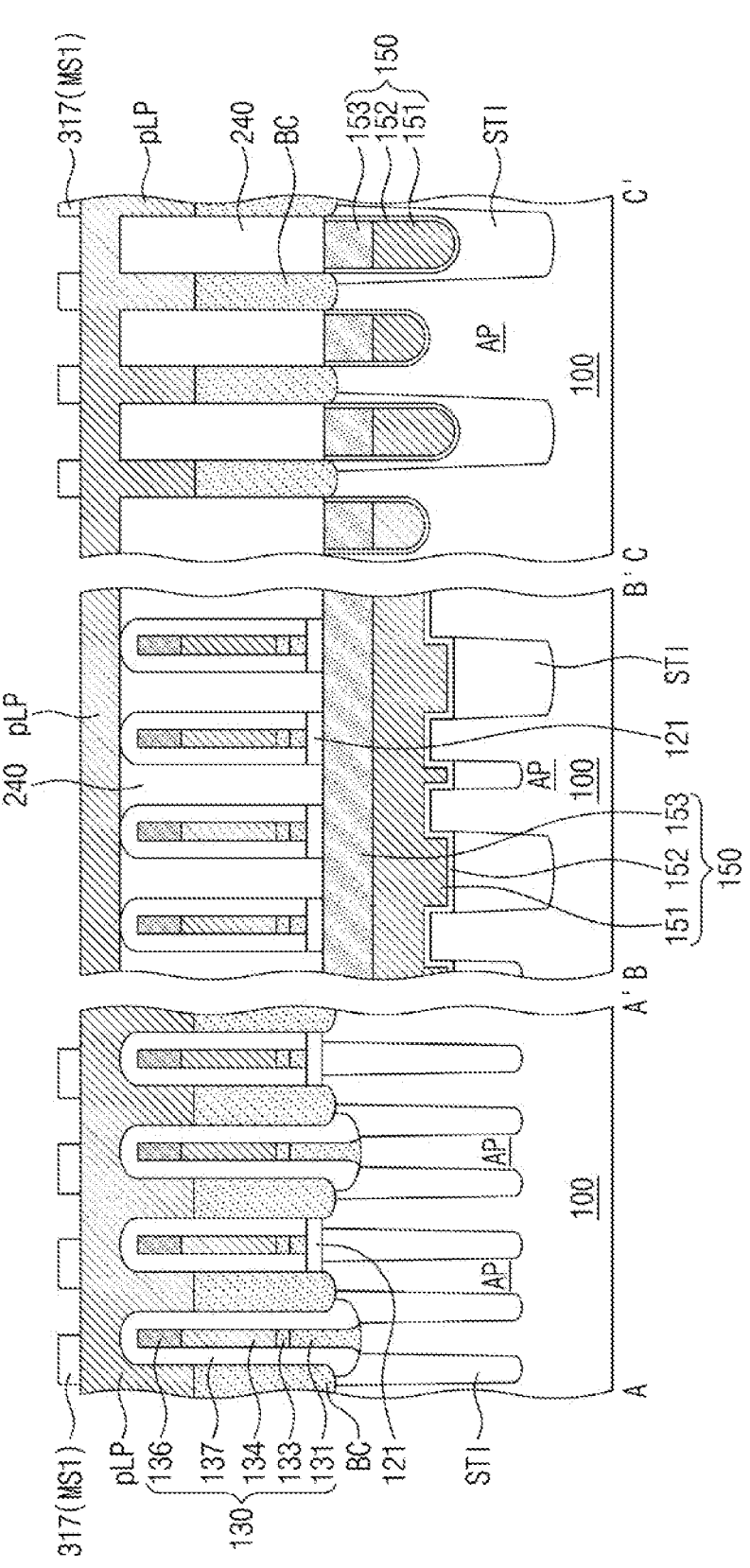
Figure 11C:
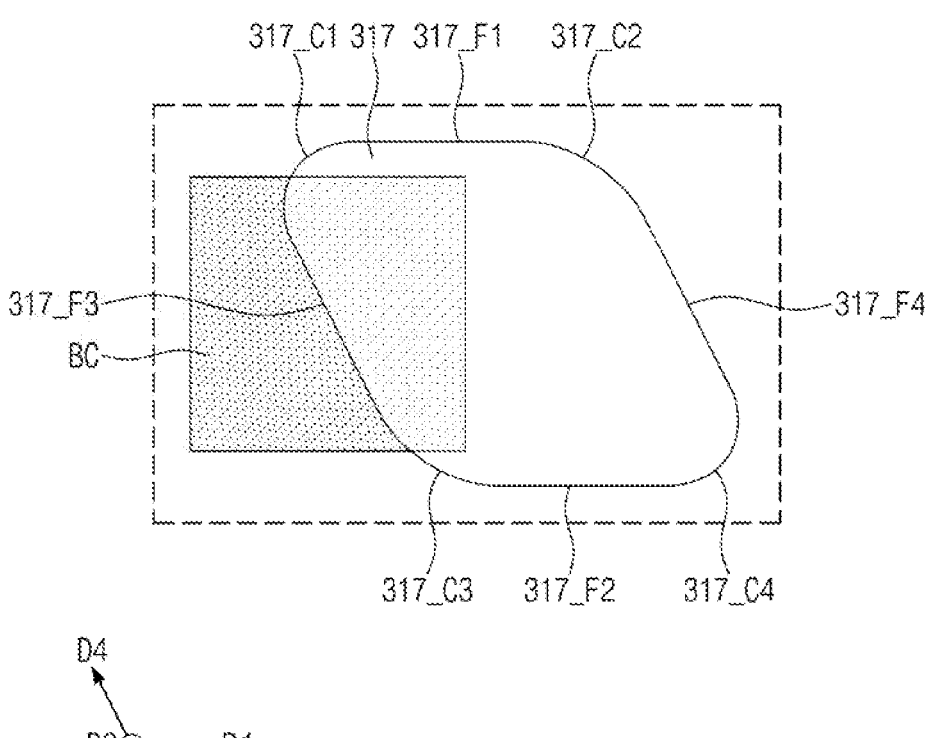

Referring to FIGS. 11A and 11B, the second mask patterns 316 may be used as an etching mask to perform an etching process. In the etching process, the base mask layer 311 may be etched to form base patterns 317. The second mask patterns 316 may be removed in a subsequent process.

A shape of the second mask pattern 316 may be transferred to form the base pattern 317. The base pattern 317 may have a first base flat sidewall 317_F1, a second base flat sidewall 317_F2 opposite to the first base flat sidewall 317_F1, a third base flat sidewall 317_F3, and a fourth base flat sidewall 317_F4 opposite to the third base flat sidewall 317_F3. The base pattern 317 may be flat at the first, second, third, and fourth base flat sidewalls 317_F1, 317_F2, 317_F3, and 317_F4. The first and second base flat sidewalls 317_F1 and 317_F2 of the base pattern 317 may extend in the first direction D1. The third and fourth base flat sidewalls 317_F3 and 317_F4 of the base pattern 317 may extend in the fourth direction D4.

The base pattern 317 may further include a first base curved sidewall 317_C1 between the first and third base flat sidewalls 317_F1 and 317_F3, a second base curved sidewall 317_C2 between the first and fourth base flat sidewalls 317_F1 and 317_F4, a third base curved sidewall 317_C3 between the second and third base flat sidewalls 317_F2 and 317_F3, and a fourth base curved sidewall 317_C4 between the second and fourth base flat sidewalls 317_F2 and 317_F4.

In an implementation, the first and fourth base curved sidewalls 317_C1 and 317_C4 of the base pattern 317 may each have a curvature radius greater than that of each of the first and fourth mask curved sidewalls 316_C1 and 316_C4 of the second mask pattern 316, and the second and third base curved sidewalls 317_C2 and 317_C3 of the base pattern 317 may each have a curvature radius greater than that of each of the second and third mask curved sidewalls 316_C2 and 316_C3 of the second mask pattern 316.

Referring to FIGS. 1A, 1, and 1C, the base patterns 317 may be used as an etching mask to perform an etching process. In the etching process, the preliminary pad layer pLP may be etched to form landing pads LP. A shape of the base pattern 317 may be transferred to form an upper part LP_U of the landing pad LP. The base patterns 317 may be removed in a subsequent process.

In an implementation, the upper part LP_U of the landing pad LP may include first and fourth pad curved sidewalls PC1 and PC4 each of which has a curvature radius greater than that of each of the first and fourth base curved sidewalls 317_C1 and 317_C4 of the base pattern 317, and the upper part LP_U of the landing pad LP may also include second and third pad curved sidewalls PC2 and PC3 each of which has a curvature radius greater than that of each of the second and third base curved sidewalls 317_C2 and 317_C3 of the base pattern 317.

A filling pattern 250 may be formed between the landing pads LP. A data storage pattern DSP may be formed which is connected to the landing pad LP.

Figure 12:
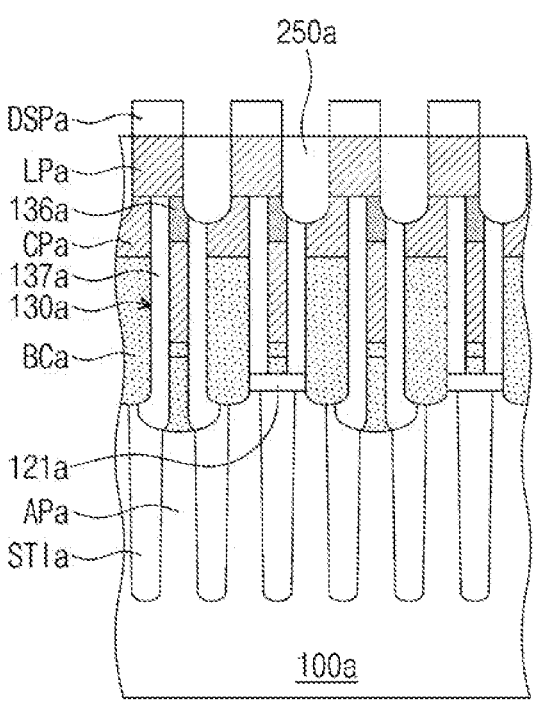
FIG. 12 illustrates a cross-sectional view showing a semiconductor device according to some embodiments.

FIG. 12 illustrates a cross-sectional view showing a semiconductor device according to some embodiments.

Referring to FIG. 12, a semiconductor device may include a substrate 100a including active patterns APa, a device isolation layer STIa, dielectric patterns 121a, bit-line structures 130a, storage node contacts BCa, landing pads LPa, a filling pattern 250a, and a data storage pattern DSPa.

A connection conductive pattern CPa may be connected to the storage node contact BCa. A top surface of the connection conductive pattern CPa may be coplanar with that of the bit-line structure 130a. The top surface of the connection conductive pattern CPa may be coplanar with that of a bit-line spacer 137a of the bit-line structure 130a and that of a bit-line capping layer 136a of the bit-line structure 130a. The landing pad LPa may be in contact with the top surface of the connection conductive pattern CPa and the top surface of the bit-line structure 130a. The landing pad LPa may be in contact (e.g., direct contact) with the top surface of the bit-line spacer 137a of the bit-line structure 130a and the top surface of the bit-line capping layer 136a of the bit-line structure 130a. The landing pad LPa may include pad flat sidewalls and pad curved sidewalls. The connection conductive pattern CPa and the landing pad LPa may include a metal.

In an implementation, the formation of the connection conductive pattern CPa may include forming a preliminary conductive layer to cover the storage node contacts BCa and the bit-line structures 130a, and forming the connection conductive patterns CPa by removing an upper part of the preliminary conductive layer and an upper part of the bit-line structure 130a.

In an implementation, the formation of the landing pads LPa may include forming a preliminary pad layer to cover the connection conductive patterns CPa and the bit-line structures 130a, forming base patterns on the preliminary pad layer, and using the base patterns as an etching process to etch the preliminary pad layer to form the landing pads LPa.

Figure 13:
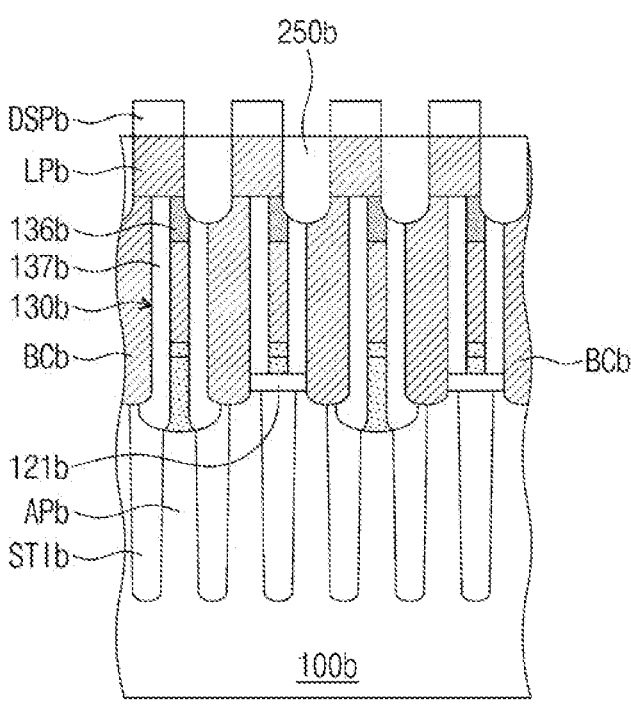
FIG. 13 illustrates a cross-sectional view showing a semiconductor device according to some embodiments.

FIG. 13 illustrates a cross-sectional view showing a semiconductor device according to some embodiments.

Referring to FIG. 13, a semiconductor device may include a substrate 100b including active patterns APb, a device isolation layer STIb, dielectric patterns 121b, bit-line structures 130b, storage node contacts BCb, landing pads LPb, a filling pattern 250b, and a data storage pattern DSPb.

The storage node contact BCb may include a metal. A top surface of the storage node contact BCb may be coplanar with that of the bit-line structure 130b. The top surface of the storage node contact BCb may be coplanar with that of a bit-line spacer 137b of the bit-line structure 130b and that of a bit-line capping layer 136b of the bit-line structure 130b. The landing pad LPb may be in contact (e.g., direct contact) with the top surface of the storage node contact BCb and with the top surface of the bit-line structure 130b. The landing pad LPb may be in contact (e.g., direct contact) with the top surface of the bit-line spacer 137b of the bit-line structure 130b and the top surface of a bit-line capping layer 136b of the bit-line structure 130b. The landing pad LPb may include pad flat sidewalls and pad curved sidewalls. The landing pad LPb may include a metal.

In an implementation, the formation of the storage node contacts BCb may include forming a preliminary contact layer to cover the bit-line structures 130b and forming the storage node contacts BCb by removing an upper part of the preliminary contact layer and an upper part of the bit-line structure 130b.

In an implementation, the formation of the landing pads LPb may include forming a preliminary pad layer to cover the storage node contacts BCb and the bit-line structures 130a, forming base patterns on the preliminary pad layer, and using the base patterns as an etching mask to etch the preliminary pad layer to form the landing pads LPb.

Figure 14:
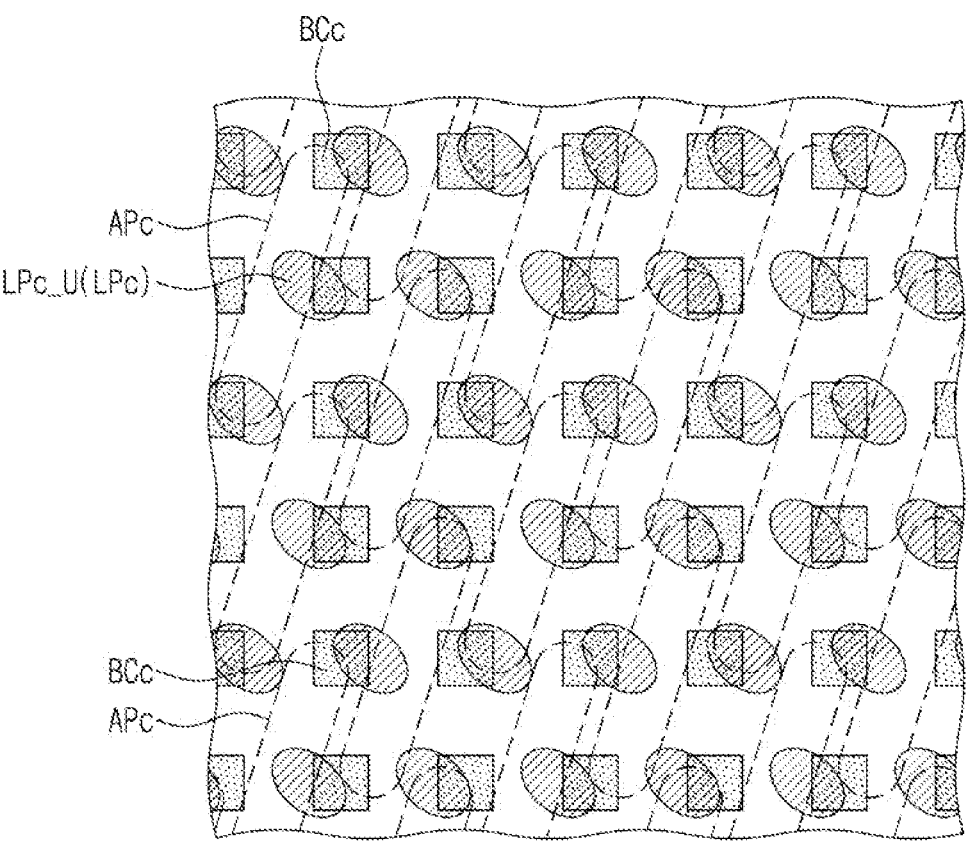
FIG. 14 illustrates a plan view showing a semiconductor device according to some embodiments.
Figure 14:
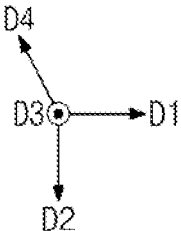

FIG. 14 illustrates a plan view showing a semiconductor device according to some embodiments.

Referring to FIG. 14, a semiconductor device may include active patterns APc, storage node contacts BCc connected to the active patterns APc, and landing pads LPc connected to the storage node contacts BCc. An upper part LPc_U of the landing pad LPc may have an oval shape that is oblique with respect to a first direction D1 and a second direction D2.

Figure 15A:
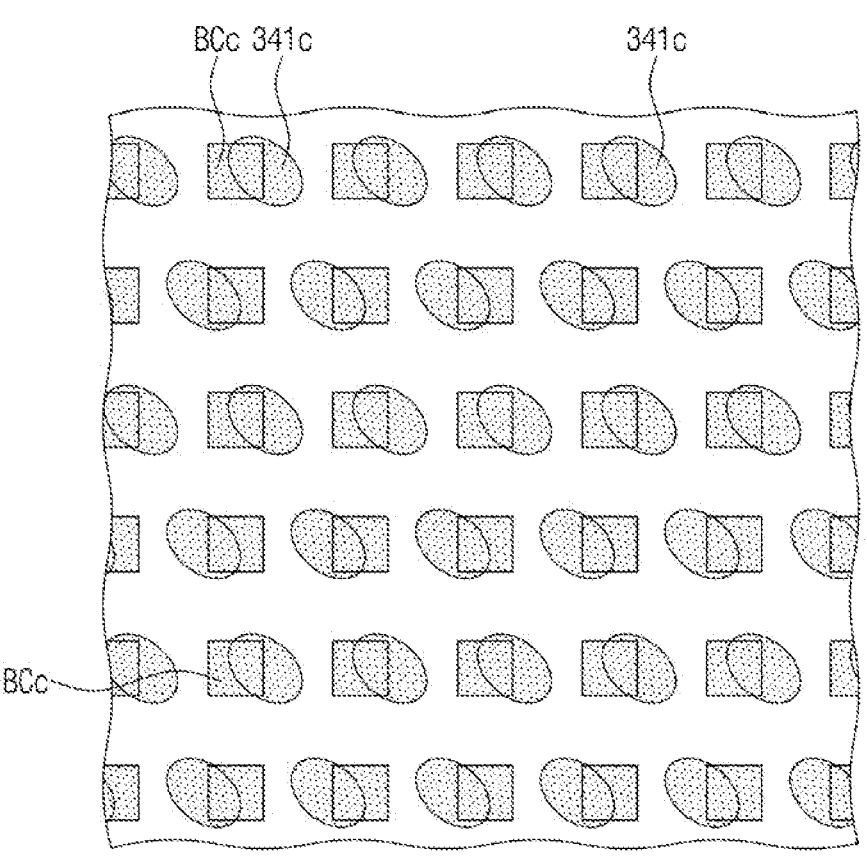
FIGS. 15A and 15B illustrate stages in a method of fabricating a semiconductor device depicted in FIG. 14.
Figure 15A:
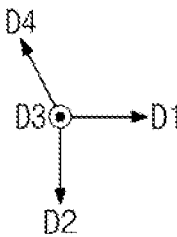
Figure 15B:
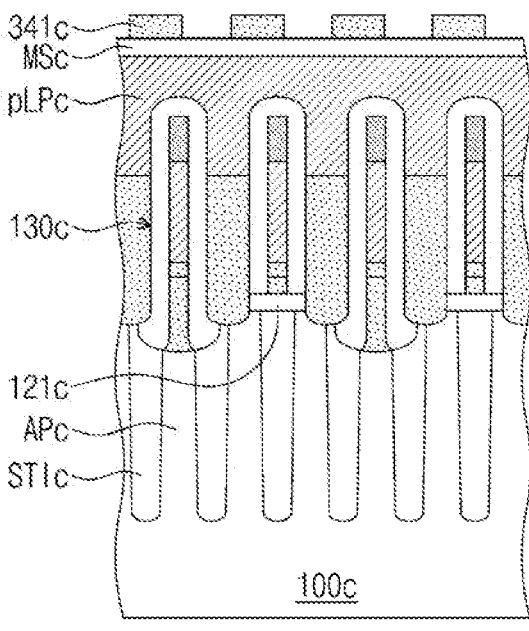

FIGS. 15A and 15B illustrate stages in a method of fabricating a semiconductor device depicted in FIG. 14.

Referring to FIGS. 15A and 15B, a substrate 100c may include active patterns APc, and a device isolation layer STIc, dielectric patterns 121c, bit-line structures 130c, storage node contacts BCc, and a preliminary pad layer pLPc may be formed.

A mask structure MSc may be formed on the preliminary pad layer pLPc. In an implementation, the mask structure MSc may include an oxide, e.g., silicon oxide may be the oxide included in the mask structure MSc.

Mask patterns 341c may be formed on the mask structure MSc. The mask pattern 341c may have an oval shape that is oblique with respect to a first direction D1 and a second direction D2. The mask pattern 341c may include, e.g., a photoresist material or a carbon-containing organic material.

The mask patterns 341c may be used as an etching mask to perform an etching process. In the etching process, the mask structure MSc may be etched to form base patterns. A shape of the mask pattern 341c may be transferred to form the base pattern. The base pattern may have an oval that is oblique with respect to the first direction D1 and the second direction D2. The mask patterns 341c may be removed in a subsequent process.

Referring to FIG. 14, the base patterns may be used as an etching mask to perform an etching process. In the etching process, the preliminary pad layer pLPc may be etched to form landing pads LPc. A shape of the base pattern may be transferred to form an upper part LPc_U of the landing pad LPc. The upper part LPc_U of the landing pad LPc may have an oval shape that is oblique with respect to a first direction D1 and a second direction D2. The base patterns may be removed in a subsequent process.

FIGS. 16A, 16B, 17A, and 17B illustrate stages in a method of fabricating a semiconductor device according to some embodiments.

Figure 16A:
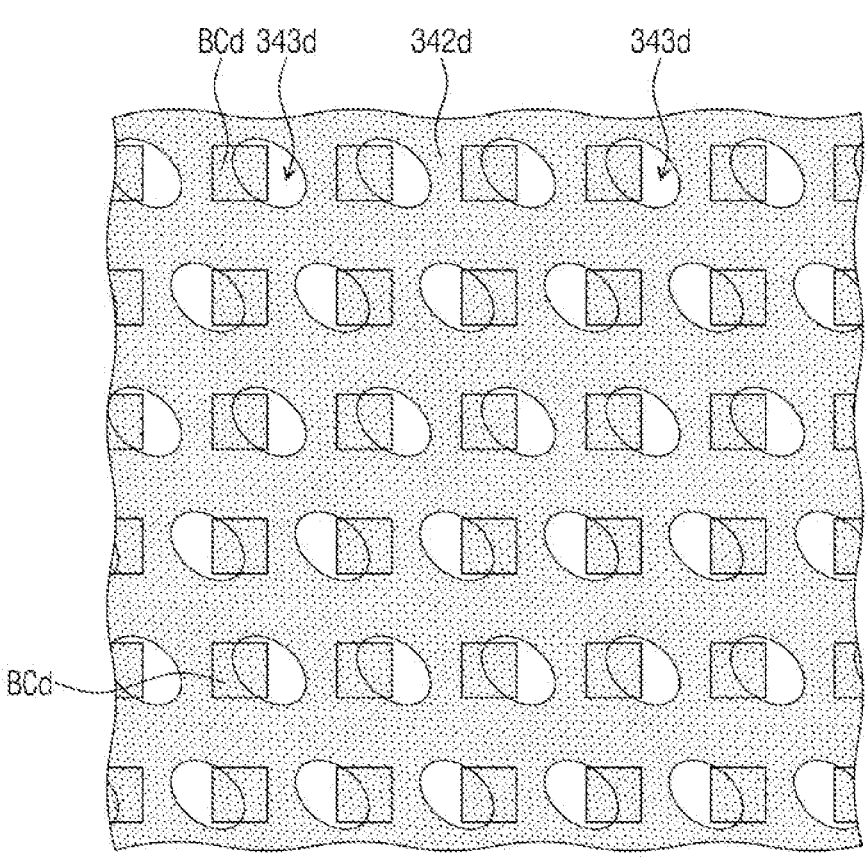
FIGS. 16A, 16B, 17A, and 17B illustrate stages in a method of fabricating a semiconductor device according to some embodiments.
Figure 16A:
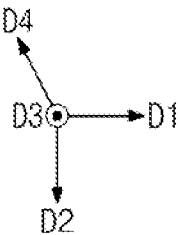
Figure 16B:
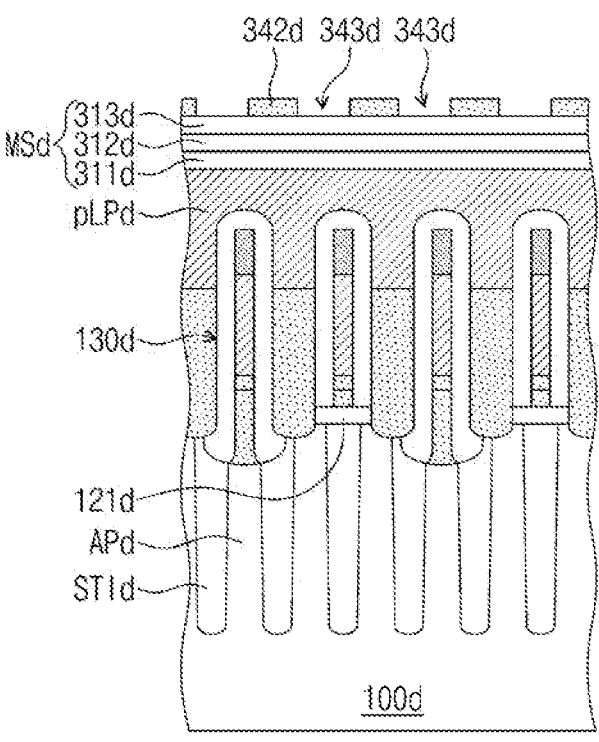

Referring to FIGS. 16A and 16B, a substrate 100d may include active patterns APd, and a device isolation layer STId, dielectric patterns 121d, bit-line structures 130d, storage node contacts BCd, and a preliminary pad layer pLPd may be formed.

A mask structure MSd may be formed on the preliminary pad layer pLPd. The mask structure MSd may include a base mask layer 311d on the preliminary pad layer pLPd, a first mask layer 312d on the base mask layer 311d, and a second mask layer 313d on the first mask layer 312d. The base mask layer 311d may include a nitride, e.g., silicon nitride may be the nitride included in the base mask layer 311d. The first mask layer 312d may include, e.g., a spin-on-hardmask (SOH) layer or an amorphous carbon layer (ACL). In an implementation, the second mask layer 313d may include an oxynitride, e.g., silicon oxynitride may be the oxynitride included in the second mask layer 313d.

A pattern layer 342d may be formed on the second mask layer 313d of the mask structure MSd. The pattern layer 342d may include first openings 343d each of which exposes a portion of the second mask layer 313d of the mask structure MSd. The first opening 343d may have an oval shape that is oblique with respect to a first direction D1 and a second direction D2. The pattern layer 342d may include, e.g., a photoresist material or a carbon-containing organic material.

Figure 17A:
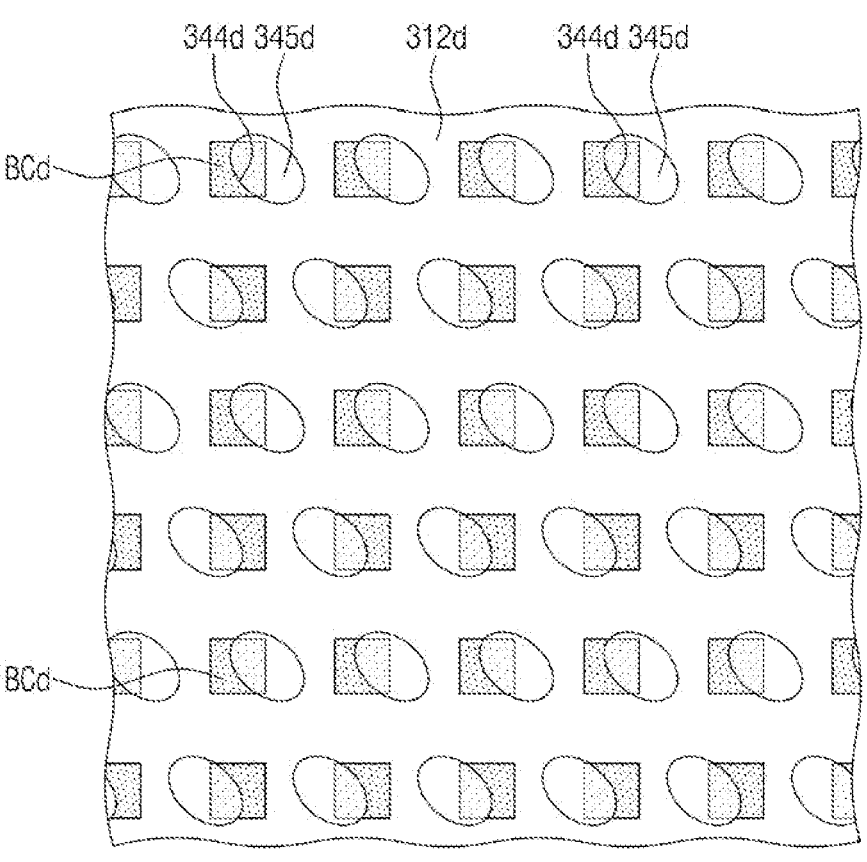
Figure 17A:
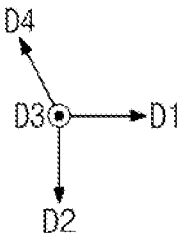
Figure 17B:
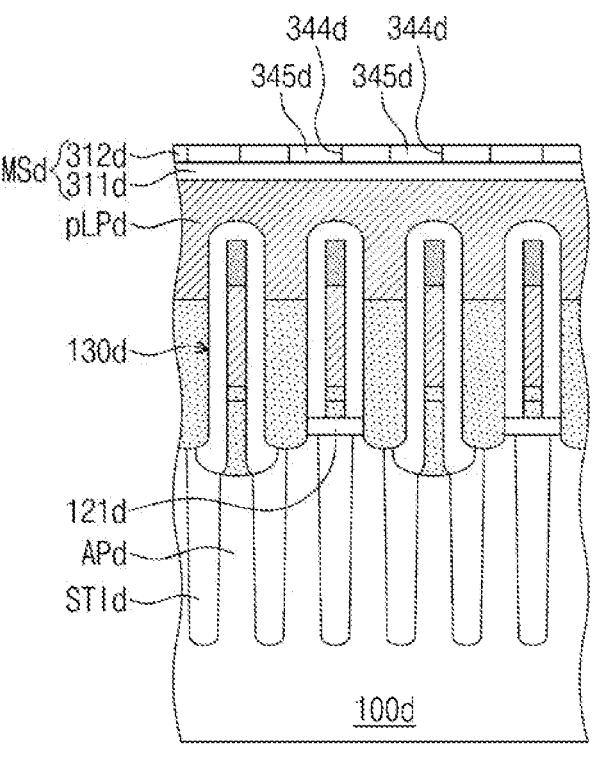

Referring to FIGS. 17A and 17B, the pattern layer 342d may be used as an etching mask to perform an etching process. In the etching process, the second mask layer 313d of the mask structure MSd may be etched to form second openings in the second mask layer 313d. A shape of the first openings 343d may be transferred to form the second openings. The second opening may have an oval shape that is oblique with respect to the first direction D1 and the second direction D2. Each of the second openings may expose a portion of the first mask layer 312d. The pattern layer 342d may be removed in a subsequent process.

The second mask layer 313d having the second openings formed therein may be used as an etching mask to perform an etching process. In the etching process, the first mask layer 312d of the mask structure MSd may be etched to form third openings 344d. A shape of the second openings may be transferred to form the third openings 344d. The third opening 344d may have an oval shape that is oblique with respect to the first direction D1 and the second direction D2. Each of the third openings 344d may expose a portion of the base mask layer 311d. The second mask layer 313d may be removed in a subsequent process.

Mask patterns 345d may be formed to fill the third openings 344d. The mask pattern 345d may have an oval shape that is oblique with respect to the first direction D1 and the second direction D2. The mask patterns 345d may include, e.g., an oxide. After the formation of the mask patterns 345d, the first mask layer 312d may be removed.

The mask patterns 345d may be used as an etching mask to perform an etching process. In the etching process, the base mask layer 311d may be etched to form base patterns. A shape of the mask patterns 345d may be transferred to form the base patterns. The base pattern may have an oval shape that is oblique with respect to the first direction D1 and the second direction D2. The mask patterns 345d may be removed in a subsequent process.

The base patterns may be used as an etching mask to perform an etching process. In the etching process, the preliminary pad layer pLPd may be etched to form landing pads. A shape of the base pattern may be transferred to form an upper part of the landing pad. The upper part of the landing pad may have an oval shape that is oblique with respect to the first direction D1 and the second direction D2. The base patterns may be removed in a subsequent process.

By way of summation and review, in high speed and low consumption electronic products, semiconductor devices embedded in the electronic products may have high operating speed and lower operating voltage. An increase in integration of semiconductor devices could cause a reduction in electrical properties and production yield of semiconductor devices. Therefore, increasing electrical properties and production yield of semiconductor devices may be considered.

One or more embodiments may provide a semiconductor device including a landing pad.

One or more embodiments may provide a semiconductor device having improved electrical properties and increased reliability.

A semiconductor device according to some embodiments may be configured to help prevent separation between upper and lower parts of a landing pad and to help prevent an electrical connection between the upper parts of the landing pads.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active pattern;
a gate structure extending lengthwise in a first direction on the active pattern;
a bit-line structure electrically connected to the active pattern;
a storage node contact electrically connected to the active pattern; and
a landing pad electrically connected to the storage node contact,
wherein the landing pad includes:
a first pad flat sidewall parallel to the first direction and a second pad flat sidewall parallel to the first direction, the first pad flat sidewall opposite to the second pad flat sidewall,
a third pad flat sidewall between the first pad flat sidewall and the second pad flat sidewall,
a fourth pad flat sidewall between the first pad flat sidewall and the second pad flat sidewall,
a first pad curved sidewall between the first pad flat sidewall and the third pad flat sidewall, and
a second pad curved sidewall between the first pad flat sidewall and the fourth pad flat sidewall,

wherein a first angle between the first pad flat sidewall and the third pad flat sidewall is less than a second angle between the first pad flat sidewall and the fourth pad flat sidewall.

2. The semiconductor device as claimed in claim 1, further comprising a data storage pattern electrically connected to the landing pad.

3. The semiconductor device as claimed in claim 1, wherein the landing pad further includes:
a third pad curved sidewall between the second pad flat sidewall and the third pad flat sidewalls, and
a fourth pad curved sidewall between the second pad flat sidewall and the fourth pad flat sidewall.

4. The semiconductor device as claimed in claim 1, wherein:
the first to fourth pad flat sidewalls are flat, and
the first and second pad curved sidewalls are curved.

5. The semiconductor device as claimed in claim 1, wherein:
the landing pad includes:
a lower part connected to the storage node contact, and
an upper part on the lower part of the landing pad, and
the first to fourth pad flat sidewalls of the landing pad and the first and second pad curved sidewalls of the landing pad are sidewalls of the upper part of the landing pad.

6. The semiconductor device as claimed in claim 5, wherein a portion of the upper part of the landing pad overlaps a portion of the storage node contact.

7. The semiconductor device as claimed in claim 1, wherein a top surface of the storage node contact is coplanar with a top surface of the bit-line structure.

8. The semiconductor device as claimed in claim 7, wherein the top surface of the storage node contact is coplanar with a top surface of a bit-line capping layer in the bit-line structure and with a top surface of a bit-line spacer in the bit-line structure.

9. The semiconductor device as claimed in claim 8, wherein the landing pad is in contact with the top surface of the bit-line capping layer and the top surface of the bit-line spacer.

10. A semiconductor device, comprising:
an active pattern;
a bit-line structure extending lengthwise in a first direction and electrically connected to the active pattern;
a storage node contact electrically connected to the active pattern; and
a landing pad electrically connected to the storage node contact,
wherein the landing pad includes:
a first pad flat sidewall parallel to a second direction and a second pad flat sidewall parallel to the second direction and that are opposite to each other,
a third pad flat sidewall between the first pad flat sidewall and the second pad flat sidewall, and
a fourth pad flat sidewall between the first pad flat sidewall and the second pad flat sidewall,
wherein the second direction is perpendicular to the first direction,
wherein the third pad flat sidewall and the fourth pad flat sidewall are parallel to each other, and
wherein a first angle between the first pad flat sidewall and the third pad flat sidewall is less than a second angle between the first pad flat sidewall and the fourth pad flat sidewall.

11. The semiconductor device as claimed in claim 10, wherein the landing pad further includes:

a first pad curved sidewall connected to the first pad flat sidewall and the third pad flat sidewall, a second pad curved sidewall connected to the first pad flat sidewall and the fourth pad flat sidewall, a third pad curved sidewall connected to the second pad flat sidewall and the third pad flat sidewall, and a fourth pad curved sidewall connected to the second pad flat sidewall and the fourth pad flat sidewall.

12. The semiconductor device as claimed in claim 11, wherein:

the first to fourth pad flat sidewalls are flat, and the first to fourth pad curved sidewalls are curved.

13. The semiconductor device as claimed in claim 11, wherein a distance between the first pad curved sidewall and the fourth pad curved sidewall is greater than a distance between the second pad curved sidewall and the third pad curved sidewall.

14. The semiconductor device as claimed in claim 10, further comprising a connection conductive pattern connected to the landing pad and the storage node contact.

15. The semiconductor device as claimed in claim 14, wherein a top surface of the connection conductive pattern is coplanar with a top surface of the bit-line structure.

16. The semiconductor device as claimed in claim 15, wherein the landing pad is in contact with the top surface of the connection conductive pattern and the top surface of the bit-line structure.

17. The semiconductor device as claimed in claim 16, wherein the landing pad is in contact with a top surface of a bit-line capping layer in the bit-line structure and with a top surface of a bit-line spacer in the bit-line structure.

18. The semiconductor device as claimed in claim 14, wherein the connection conductive pattern and the landing pad include a metal.

19. A semiconductor device, comprising:

an active pattern;

a gate structure extending lengthwise in a first direction on the active pattern;

a dielectric pattern on the gate structure;

a bit-line structure on the dielectric pattern;

a storage node contact on a sidewall of the bit-line structure;

a landing pad electrically connected to the storage node contact; and a filling pattern that surrounds the landing pad, wherein the landing pad includes:

a lower part connected to the storage node contact, and an upper part on the lower part of the landing pad, wherein the upper part of the landing pad includes:

a first pad flat sidewall and a second pad flat sidewall that are opposite to each other and are both parallel to the first direction, a third pad flat sidewall between the first pad flat sidewall and the second pad flat sidewall, a fourth pad flat sidewall between the first pad flat sidewall and the second pad flat sidewall, a first pad curved sidewall connected to the first pad flat sidewall and the third pad flat sidewall, a second pad curved sidewall connected to the first pad flat sidewall and the fourth pad flat sidewall, a third pad curved sidewall connected to the second pad flat sidewall and the third pad flat sidewall, and a fourth pad curved sidewall connected to the second pad flat sidewall and the fourth pad flat sidewall, wherein the first to fourth pad flat sidewalls are flat, wherein the first to fourth pad curved sidewalls are curved, and wherein a distance between the first pad curved sidewall and the fourth pad curved sidewall is greater than a distance between the second pad curved sidewall and the third pad curved sidewall.

20. The semiconductor device as claimed in claim 19, wherein:

the first pad flat sidewall and the second pad flat sidewall are parallel to each other, and the third pad flat sidewall and the fourth pad flat sidewall are parallel to each other.

\* \* \* \* \*